United States Patent
Lee et al.

(10) Patent No.: US 12,238,911 B2
(45) Date of Patent: Feb. 25, 2025

(54) ELECTRONIC DEVICE INCLUDING SHEILDING STRUCTURE

(71) Applicant: SAMSUNG ELECTRONICS CO., LTD., Suwon-si (KR)

(72) Inventors: Haejin Lee, Suwon-si (KR); Min Park, Suwon-si (KR); Kyuhwan Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 129 days.

(21) Appl. No.: 17/986,242

(22) Filed: Nov. 14, 2022

(65) Prior Publication Data

US 2023/0156989 A1 May 18, 2023

Related U.S. Application Data

(63) Continuation of application No. PCT/KR2022/017677, filed on Nov. 11, 2022.

(30) Foreign Application Priority Data

Nov. 12, 2021 (KR) .......... 10-2021-0155669
Dec. 16, 2021 (KR) .......... 10-2021-0180997

(51) Int. Cl.
*H05K 9/00* (2006.01)
*H04M 1/02* (2006.01)
*H05K 1/02* (2006.01)

(52) U.S. Cl.
CPC ........ *H05K 9/0088* (2013.01); *H04M 1/0277* (2013.01); *H05K 1/0203* (2013.01); *H05K 9/0024* (2013.01); *H05K 9/009* (2013.01)

(58) Field of Classification Search
CPC ..... H05K 9/0024; H05K 9/0088; H05K 9/009
See application file for complete search history.

(56) References Cited

U.S. PATENT DOCUMENTS 10,596,780 B2    3/2020   Seo et al.
2008/0057265 A1  3/2008   Liang et al.
(Continued)

FOREIGN PATENT DOCUMENTS

JP    2016-096249      5/2016
KR    10-2014-0131115  11/2014
(Continued)

OTHER PUBLICATIONS

Search Report and Written Opinion dated Feb. 10, 2023 issued in International Patent Application No. PCT/KR2022/017677.
(Continued)

*Primary Examiner* — Hung V Ngo
(74) *Attorney, Agent, or Firm* — Nixon & Vanderhye P.C.

(57) ABSTRACT

The disclosure relates to an electronic device including: a circuit board; a first component disposed on the circuit board; a shield can disposed to surround at least a part of the first component and including an opening; and a nanofiber film disposed on the shield can to cover the opening, wherein the nanofiber film includes a first layer, a second layer, and a third layer sequentially laminated in a first direction, the first layer or the third layer having a lower electrical resistance value than an electrical resistance value of the second layer in a second direction different from the first direction, and the second layer has a lower electrical resistance value than an electrical resistance value of the first layer or the third layer in the first direction.

12 Claims, 17 Drawing Sheets

(56) References Cited

U.S. PATENT DOCUMENTS

| | | | |
|---|---|---|---|
| 2014/0151111 A1 | 6/2014 | Shah et al. | |
| 2016/0049662 A1 | 2/2016 | Kim et al. | |
| 2018/0143671 A1 | 5/2018 | Lee et al. | |
| 2018/0194102 A1 | 7/2018 | Lima et al. | |
| 2018/0288908 A1* | 10/2018 | Lee | H05K 9/0031 |
| 2020/0053919 A1 | 2/2020 | Lee et al. | |
| 2020/0137931 A1 | 4/2020 | Lee et al. | |
| 2021/0001605 A1 | 1/2021 | Matsumoto et al. | |
| 2021/0029853 A1 | 1/2021 | Kim et al. | |
| 2021/0029855 A1* | 1/2021 | Yoon | H01L 23/4006 |
| 2021/0068244 A1 | 3/2021 | Jung | |
| 2021/0161039 A1 | 5/2021 | Jung et al. | |
| 2021/0219470 A1* | 7/2021 | Lee | H05K 9/0037 |
| 2021/0251110 A1 | 8/2021 | Lee et al. | |

FOREIGN PATENT DOCUMENTS

| | | |
|---|---|---|
| KR | 10-1558418 | 10/2015 |
| KR | 10-1936852 | 1/2019 |
| KR | 10-2020-0017115 | 2/2020 |
| KR | 10-2021-0063824 | 6/2021 |
| KR | 10-2021-0094399 | 7/2021 |
| WO | 2019/035697 | 2/2019 |

OTHER PUBLICATIONS

European Search Report dated Oct. 17, 2024 for EP Application No. 22893244.8.
Extended European Search Report dated Jan. 10, 2025 for EP Application No. 22893244.8.

\* cited by examiner

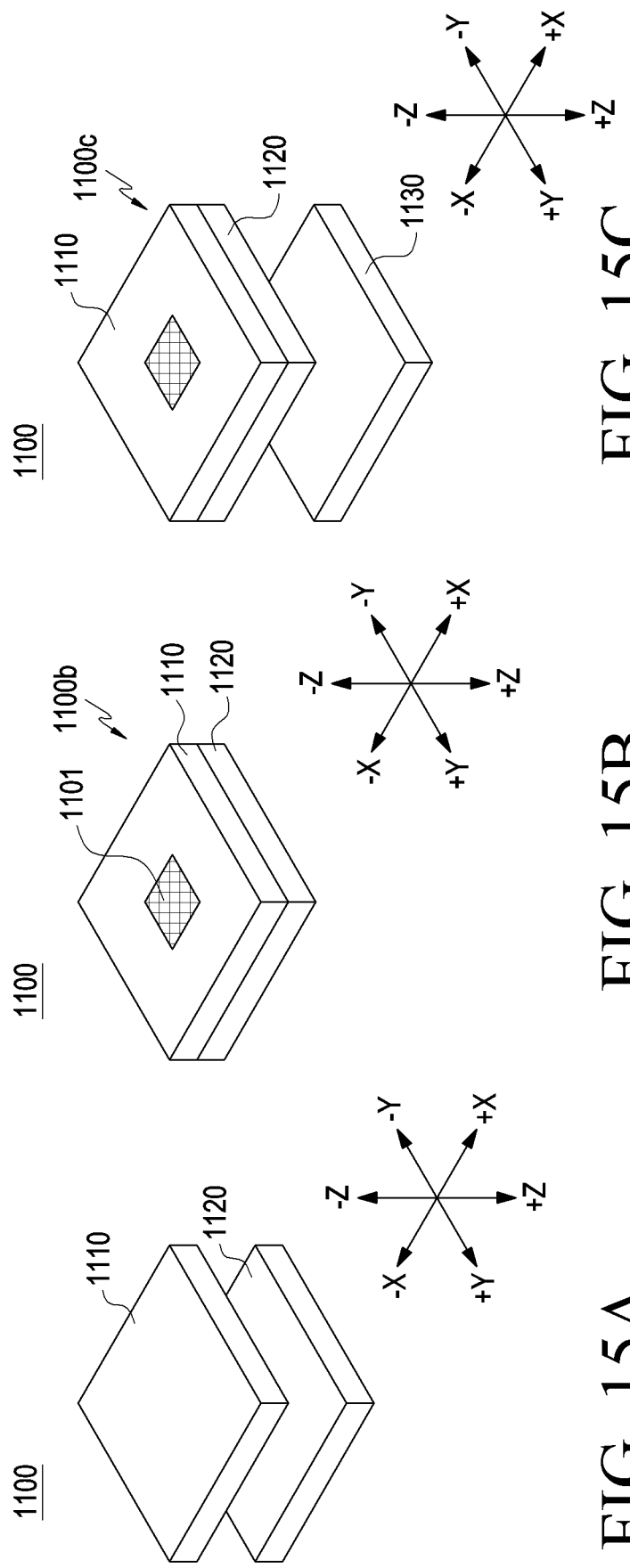

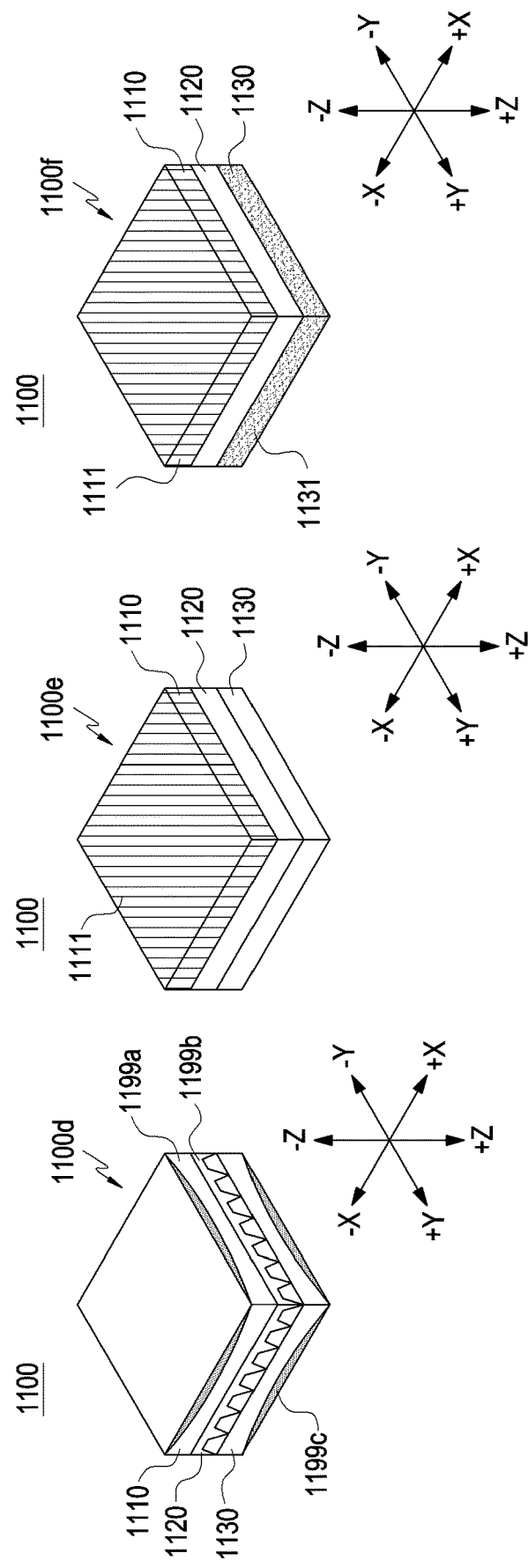

ELECTRONIC DEVICE INCLUDING SHEILDING STRUCTURE

CROSS-REFERENCE TO RELATED APPLICATIONS

This application is a continuation of International Application No. PCT/KR2022/017677 designating the U.S., filed on Nov. 11, 2022, in the Korean Intellectual Property Receiving Office and claiming priority to Korean Patent Application No. 10-2021-0155669, filed on Nov. 12, 2021, in the Korean Intellectual Property Office, and to Korean Patent Application No. 10-2021-0180997, filed on Dec. 16, 2021, in the Korean Intellectual Property Office, the disclosures of all of which are incorporated by reference herein in their entireties.

BACKGROUND

Field

The disclosure relates to an electronic device including a shielding structure.

Description of Related Art

Electronic devices may refer to device configured to perform specific functions according to installed programs, such as home appliances, electronic wallets, portable multimedia players, mobile communication terminals, tablet PCs, video/audio devices, desktop/laptop computers, and vehicle navigation systems. For example, electronic devices may output stored information as sounds or images. In line with the high degree of integration of electronic devices and the widespread use of super-fast large-capacity wireless communication, it has recently become possible to equip a single electronic device (for example, mobile communication terminal) with various functions. For example, not only a communication function, but also an entertainment function (for example, gaming), a multimedia function (for example, music/video playback), communication and security functions for mobile banking and the like, a scheduling function, and an electronic wallet function may be integrated into a single electronic device. Such electronic devices have become compact such that users can conveniently carry the same.

An electronic device may have various electronic components (for example, application processor) existing therein. Such an environment may require a shielding structure for dispersing heat and electromagnetic waves generated by the electronic components. A shield can may be used to shield an electronic component, but if the electronic component is sealed by a metal material, the internal temperature of the shield can may rise and may cause a problem related to the durability of the electronic component.

SUMMARY

Embodiments of the disclosure provide a nanofiber film disposed on a shield can may be used to efficiently disperse heat and electromagnetic waves generated by an electronic component.

According to various example embodiments, an electronic device may include: a circuit board; a first component disposed on the circuit board; a shield can disposed to surround at least a part of the first component and including an opening; and a nanofiber film disposed on the shield can to cover the opening, wherein the nanofiber film includes a first layer, a second layer, and a third layer sequentially laminated in a first direction, the first layer or the third layer is configured to have a lower electrical resistance value than the second layer in a second direction different from the first direction, and the second layer is configured to have a lower electrical resistance value than the first layer or the third layer in the first direction.

According to various example embodiments, a method for manufacturing a nanofiber film is provided, the method including: bonding a lower surface of a first layer and an upper surface of a second layer; bonding a lower surface of the second layer and an upper surface of a third layer; and plating the first, second and third layers with a conductive material, wherein an electrical resistance value of the second layer in a first direction is configured to be less than an electrical resistance value of the first layer or the third layer in the first direction.

According to various example embodiments, a method for manufacturing an electronic device is provided, the method including: preparing a circuit board, a first component disposed on the circuit board, a shield can disposed to surround at least a part of the first component and including an opening, and a nanofiber film, the nanofiber film including a first layer, a second layer, and a third layer sequentially laminated in a first direction, the first layer or the third layer being configured to have an electrical resistance value lower than an electrical resistance value the second layer in a second direction different from the first direction, the second layer being configured to have a lower electrical resistance value than an electrical resistance value of the first layer or the third layer in the first direction; arranging a filling member comprising a thermally conductive material on an upper position of first component; and arranging the nanofiber film to shield the openings.

According to various example embodiments of the disclosure, a nanofiber film may shield an opening of a shield can such that electromagnetic waves generated by a first component can be dispersed.

According to various example embodiments of the disclosure, a nanofiber film may contact a shield can such that heat generated by a first component can be dispersed.

BRIEF DESCRIPTION OF THE DRAWINGS

The above and other aspects, features and advantages of certain embodiments of the present disclosure will be more apparent from the following detailed description, taken in conjunction with the accompanying drawings, in which:

FIGS. 15A, 15B, 15C, 15D, 15E and 15F are various perspective views illustrating an example manufacturing process for a nanofiber film according to various embodiments;

DETAILED DESCRIPTION

Figure 1:
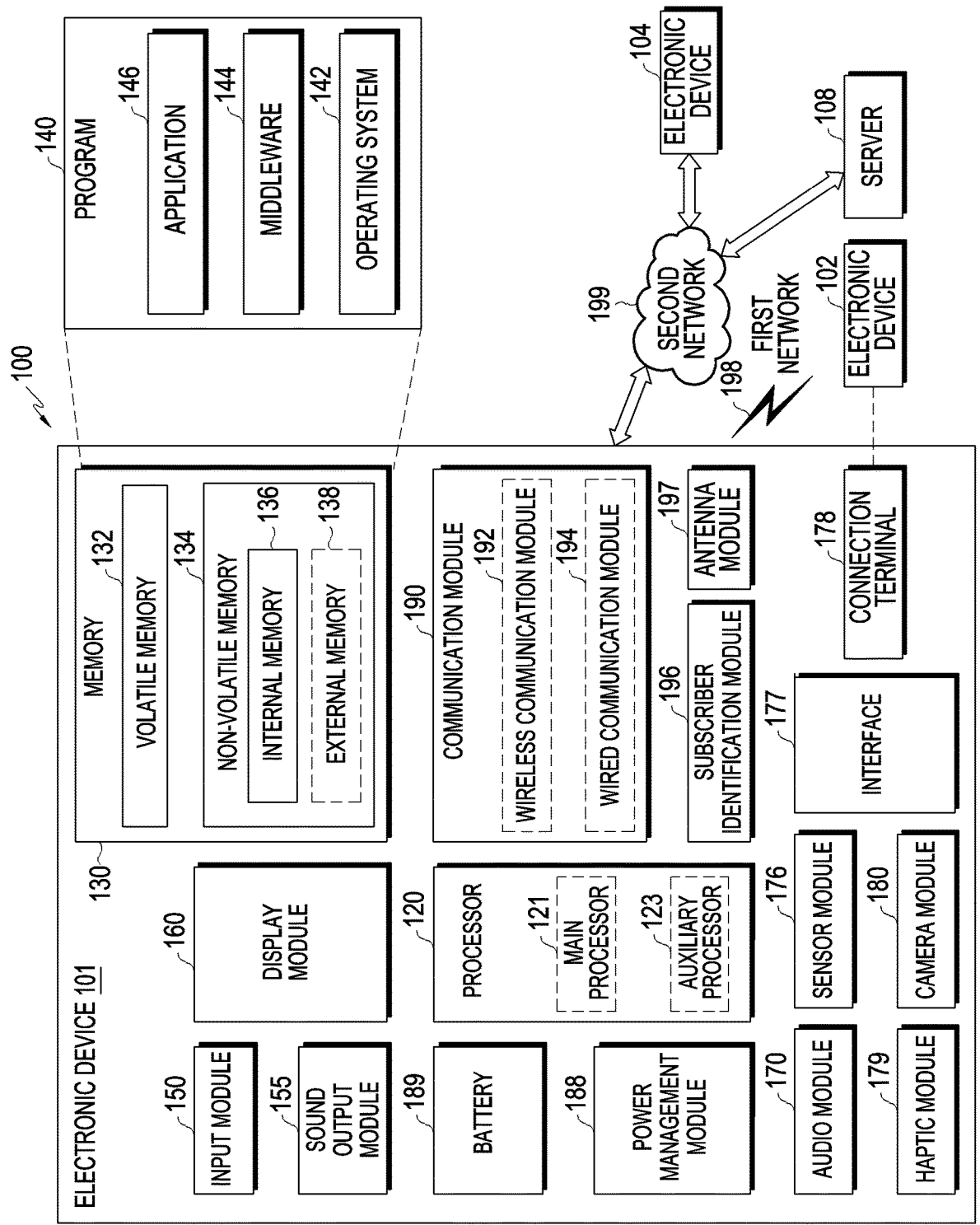
FIG. 1 is a block diagram illustrating an example electronic device in a network environment according to various embodiments.

FIG. 1 is a block diagram illustrating an example electronic device in a network environment according to various embodiments of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more external devices of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
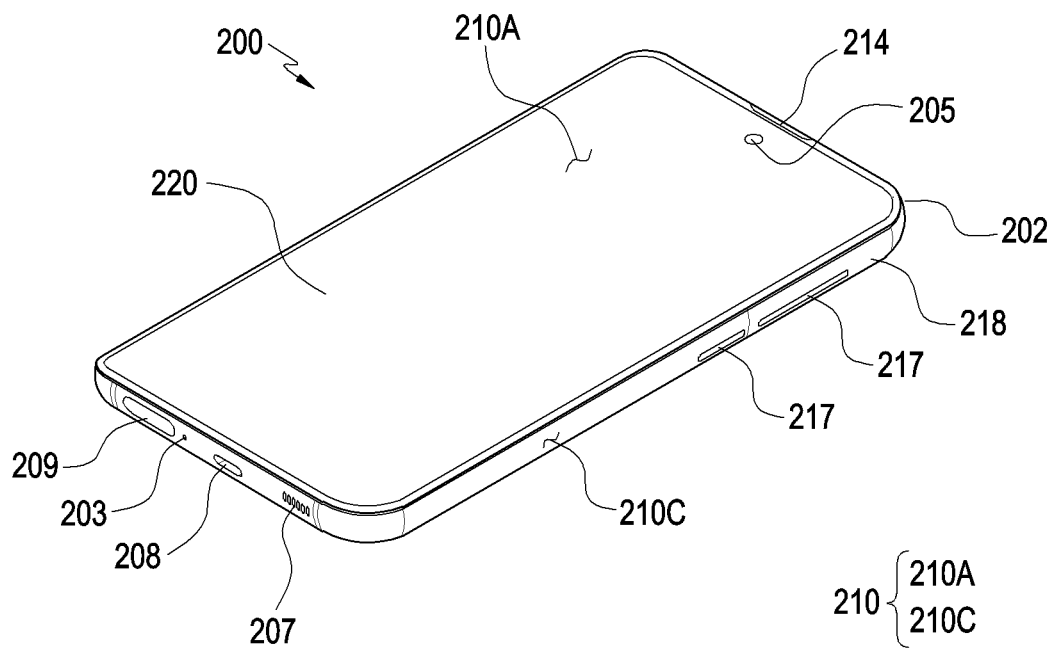
FIG. 2 is a front perspective view of an electronic device according to various embodiments.
Figure 3:
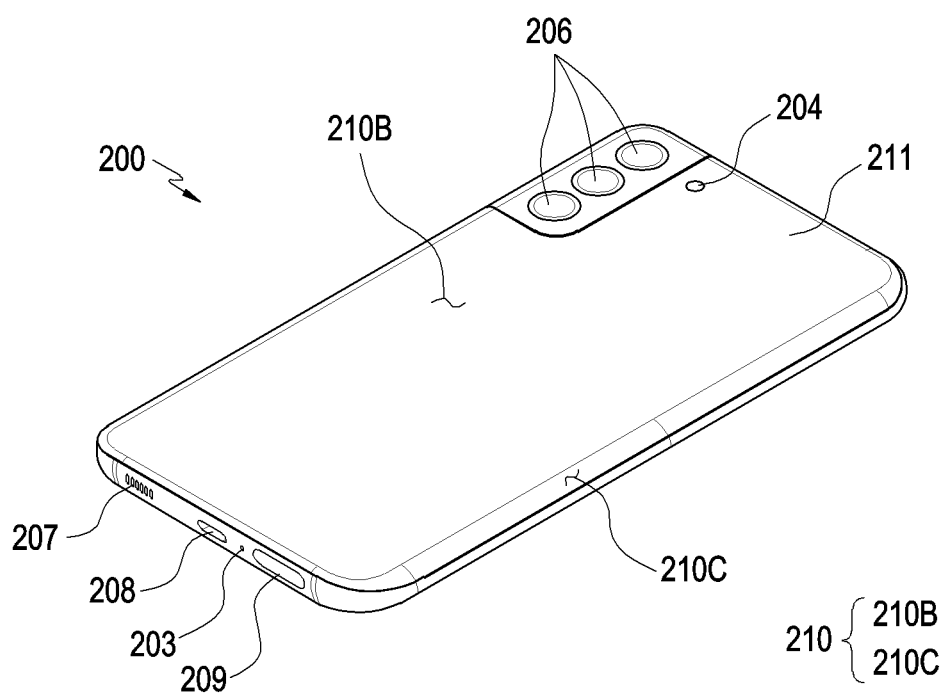
FIG. 3 is a rear perspective view of an electronic device according to various embodiments.

FIG. 2 is a front perspective view of an electronic device according to various embodiments. FIG. 3 is a rear perspective view of an electronic device according to various embodiments.

Referring to FIG. 2 and FIG. 3, an electronic device 200 according to an embodiment may include a housing 210 including a front surface 210A, a rear surface 210B, and a side surface 210C which surrounds the space between the front surface 210A and the rear surface 210B. In an embodiment (not illustrated), the housing 210 may refer to a structure configuring a part of the front surface 210A in FIG. 2, and the rear surface 210B and the side surface 310C in FIG. 3. For example, the housing 210 may include a front plate 202 and a rear plate 211. According to an embodiment, at least a portion of the front surface 210A may be formed by a front plate 202 (e.g., a glass plate including various coating layers, or a polymer plate) which is substantially transparent. The rear surface 210B may be configured by a rear plate 211. The rear plate 211 may be made of, for example, glass, ceramic, a polymer, a metal (e.g., titanium (Ti), stainless steel (STS), aluminum (Al), and/or magnesium (Mg)), or a combination of at least two of the above materials. The side surface 210C may be configured by a side bezel structure 218 (or "side surface member") which is coupled to the front plate 202 and the rear plate 211 and includes a metal and/or a polymer. In an embodiment, the rear plate 211 and side bezel structure 218 may be integrally formed with each other and include the same material (e.g., glass, a metal material such as aluminum, or ceramic). In an embodiment, the front surface 210A and/or the front plate 202 may be understood as a part of the display 220.

According to an embodiment, the electronic device 200 may include at least one of a display 220, audio modules 203, 207, and 214 (e.g., the audio module 170 of FIG. 1), a sensor module (e.g., the sensor module 176 of FIG. 1), camera modules 205 and 206 (e.g., the camera module 180 of FIG. 1), a key input device 217 (e.g., the input module 150 of FIG. 1), and connector holes 208 and 209 (e.g., the connection terminal 178 of FIG. 1). In various embodiments, at least one of the elements (e.g., the connector hole 209) may be omitted from the electronic device 200 or another element may be added thereto. According to an embodiment, the display 220 may be visually exposed through, for example, a substantial portion of the front plate 202.

According to an embodiment, the surface (or the front plate 202) of the housing 210 may include a screen display region formed when the display 220 is visually exposed. For example, the screen display region may include the front surface 210A.

In an embodiment (not illustrated), the electronic device 200 may include a recess or opening disposed in a portion of the screen display area (e.g., the front surface 210A) of the display 220, and may include at least one of an audio module 214 aligned with the recess or opening, a sensor module (not illustrated), a light-emitting element (not illustrated), and a camera module 205. In an embodiment (not illustrated), the rear surface of the screen display region of the display 220 may include at least one of an audio module 214, a sensor module (not illustrated), a camera module 205, a fingerprint sensor (not illustrated), and a light-emitting element (not illustrated).

In an embodiment (not illustrated), the display 220 may be coupled to or disposed adjacent to a touch sensing circuit, a pressure sensor capable of measuring the intensity (pressure) of a touch, and/or a digitizer configured to detect a magnetic field type stylus pen.

In various embodiments, at least one of the key input devices 217 may be disposed on the side bezel structure 218.

According to an embodiment, the audio modules 203, 207, and 214 may include, for example, a microphone hole 203 and speaker holes 207 and 214. The microphone hole 303 may include a microphone disposed inside thereof and configured to acquire external sound, and in an embodiment, may include a plurality of microphones arranged to sense the direction of sound. The speaker holes 207 and 214 may include an external speaker hole 207 and a call receiver hole 214. In various embodiments, the speaker holes 207 and 214 and the microphone hole 203 may be implemented as a single hole, or a speaker may be included without the speaker holes 207 and 214 (e.g., a piezo speaker).

According to an embodiment, the sensor module (not illustrated) may generate an electrical signal or a data value corresponding to, for example, an internal operation state of the electronic device 200 or an external environment state. The sensor module (not illustrated) may include, for example, a first sensor module (not illustrated) (e.g., a proximity sensor) and/or a second sensor module (not illustrated) (e.g., a fingerprint sensor) disposed on the front surface 210A of the housing 210. The sensor module (not illustrated) may include a third sensor module (not illustrated) (e.g., a HRM sensor) and/or a fourth sensor module (not illustrated) (e.g., a fingerprint sensor) disposed on the rear surface 210B of the housing 210. In various embodiments (not illustrated), the fingerprint sensor may be disposed not only on the front surface 210A (e.g., the display 220) of the housing 210 but also on the rear surface 210B thereof. The electronic device 200 may further include a sensor module (not illustrated), for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor (not illustrated).

According to an embodiment, the camera modules 205 and 206 may include, for example, a front camera module 205 disposed on the front surface 210A of the electronic device 200, and a rear camera module 206 and/or a flash 204 disposed on the rear surface 210B thereof. The camera modules 205 and 206 may include one or more lenses, an image sensor, and/or an image signal processor. The flash 204 may include, for example, a light-emitting diode or a xenon lamp. In various embodiments, two or more lenses (an infrared camera, and a wide-angle and telephoto lens) and image sensors may be disposed on one surface of the electronic device 200.

According to an embodiment, the key input devices 217 may be disposed on the side surface 210C of the housing 210. In an embodiment, the electronic device 200 may not include some or all of the key input devices 217 mentioned above, and the key input device 217 which is not included therein may be implemented in a different form, such as a soft key, on the display 220.

According to an embodiment, the light-emitting element (not illustrated) may be disposed, for example, on the front surface 210A of the housing 210. For example, the light-emitting element (not illustrated) may provide, for example, state information of the electronic device 101 in the form of light. In an embodiment, the light-emitting element (not illustrated) may provide, for example, a light source interworking with the operation of the front camera module 205. The light-emitting element (not illustrated) may include, for example, an LED, an IR LED, and/or a xenon lamp.

According to an embodiment, the connector holes 208 and 209 may include, for example, a first connector hole 208 capable of accommodating a connector (e.g., a USB connector) configured to transmit and receive power and/or data to and from an external electronic device or a connector (e.g., an earphone jack) configured to transmit and receive audio signals to and from an external electronic device, and/or a second connector hole 209 capable of accommodating a storage device (e.g., a subscriber identification module (SIM) card). According to an embodiment, the first connector hole 208 and/or the second connector hole 209 may be omitted.

Figure 4:
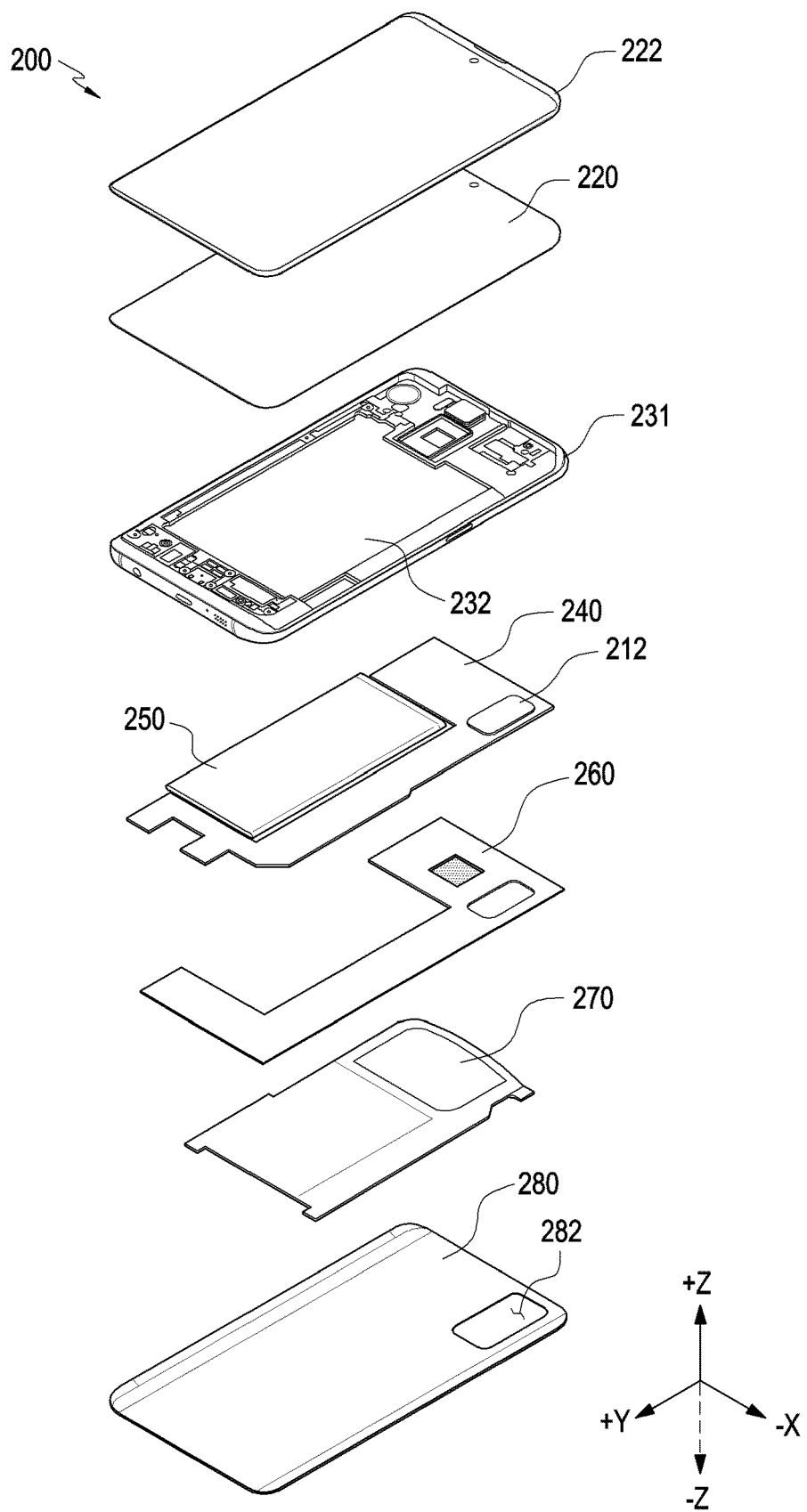
FIG. 4 is an exploded perspective view of an electronic device according to various embodiments.

FIG. 4 is an exploded perspective view of an electronic device according to various embodiments.

Referring to FIG. 4, the electronic device 200 (e.g., the electronic device 200 of FIG. 2 to FIG. 3) may include at least one of a front plate 222 (e.g., the front plate 202 of FIG. 2), a display 220 (e.g., the display 220 of FIG. 2), a bracket 232 (e.g., a front support member), a printed circuit board 240, a battery 250, a rear case 260 (e.g., a second support member), an antenna 270, and a rear plate 280 (e.g., the rear plate 211 in FIG. 3). In various embodiments, the electronic device 200 may omit at least one (e.g., the rear case 260) of the elements or may additionally include another element. At least one of the elements of the electronic device 200 may be the same as or similar to at least one of the elements of the electronic device 200 of FIG. 2 or FIG. 3, and redundant descriptions will be omitted below.

According to an embodiment, the bracket 232 may be disposed in the electronic device 200 to be connected to the side bezel structure 231 or may be integrally configured with the side bezel structure 231. The bracket 232 may be made of, for example, a metal material and/or a non-metal material (e.g., a polymer). The bracket 232 may accommodate the display 220 on one surface thereof and the printed circuit board 240 on the other surface thereof. The printed circuit board 240 may be equipped with a processor (e.g., the processor 120 of FIG. 1), a memory (e.g., the memory 130 of FIG. 1), and/or an interface (e.g., the interface 177 of FIG. 1).

According to an embodiment, the battery 250, which is a device for supplying power to at least one element (e.g., the camera module 212) of the electronic device 200, may include, for example, a non-rechargeable primary battery or a rechargeable secondary battery, or a fuel cell. At least a part of the battery 250 may be disposed, for example, on a substantially the same plane as the printed circuit board 240. The battery 250 may be integrally disposed inside the electronic device 200 or may be disposed to be detachable from the electronic device 200.

According to an embodiment, the rear case 260 may be disposed between the printed circuit board 240 and the antenna 270. For example, the rear case 260 may include one surface to which at least one of the printed circuit board 240 and the battery 250 is coupled, and the other surface to which the antenna 270 is coupled.

According to an embodiment, the antenna 270 may be disposed between the rear plate 280 and the battery 250. The antenna 270 may include, for example, a near field communication (NFC) antenna, a wireless charging antenna, and/or a magnetic secure transmission (MST) antenna. The antenna 270 may, for example, perform short-range communication with an external device or wirelessly transmit/receive power required for charging. For example, the antenna 270 may include a coil for wireless charging. In an embodiment, an antenna structure may be configured by a part of the side bezel structure 231 and/or the bracket 232 or a combination thereof.

According to various embodiments, the electronic device 200 may include a camera module 212 disposed in a housing (e.g., the housing 210 of FIG. 2). According to an embodiment, the camera module 212 may be disposed on the bracket 232 and may be a rear camera module (e.g., the camera module 212 of FIG. 3) capable of acquiring an image of a subject located in the rear (e.g., −Z direction) of the electronic device 200. According to an embodiment, at least a part of the camera module 212 may be exposed to the outside of the electronic device 200 through an opening 282 disposed on the rear plate 280.

Although the electronic device 200 illustrated in FIG. 2 to FIG. 4 has a bar type or plate type exterior, the disclosure is not limited thereto. For example, the illustrated electronic device may be a rollable electronic device or a foldable electronic device. The term "rollable electronic device" may refer to an electronic device which includes a display (e.g., the display 220 of FIG. 4) capable of bending deformation such that at least a portion thereof is wound or rolled or accommodated in a housing (e.g., the housing 210 of FIG. 2). According to a user's need, the rollable electronic device may have an expanded screen display region available by unfolding a display or causing a larger area of the display to be exposed to the outside.

Figure 5:
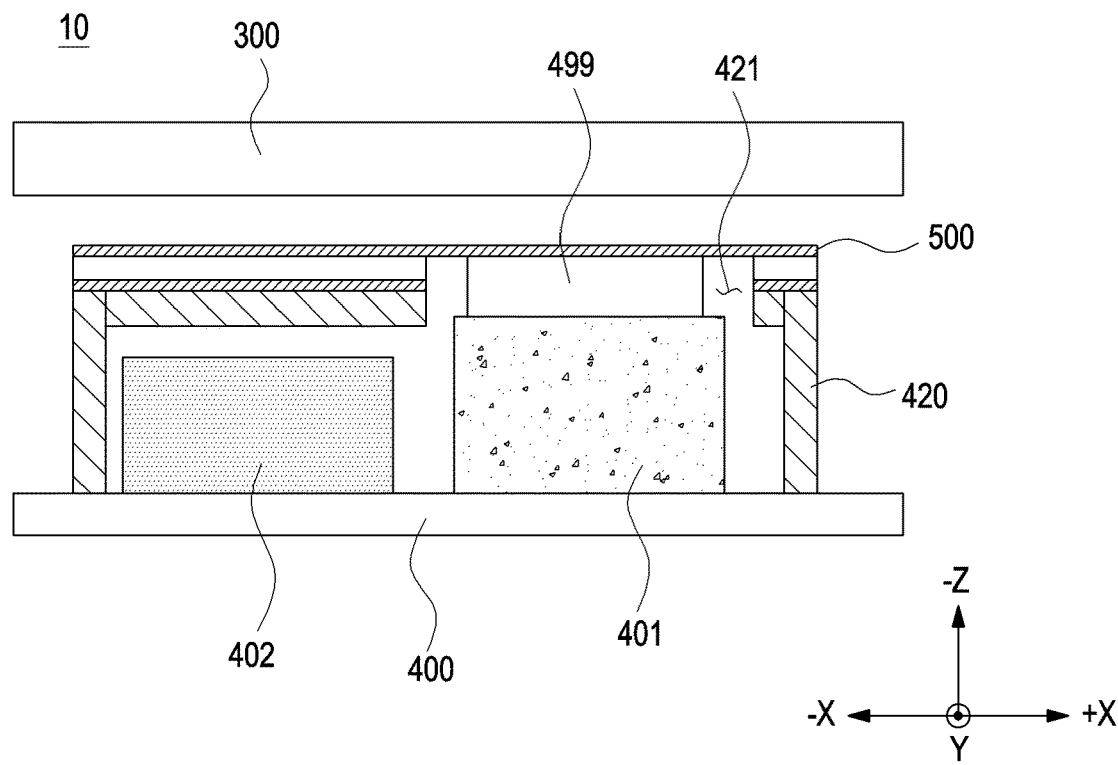
FIG. 5 is a cross-sectional view illustrating an arrangement relationship of a shielding structure according to various embodiments.

According to various embodiments, the electronic device 200 may include a shielding structure (e.g., the shielding structure 10 of FIG. 5) for shielding an internal electronic component (e.g., the first component 401 of FIG. 5). The shielding structure 10 may shield the electronic component (e.g., the first component 401 of FIG. 5) disposed on the printed circuit board 240 and may diffuse heat or electromagnetic waves generated from the electronic component (e.g., the first component 401 of FIG. 5). According to various embodiments, the shielding structure (e.g., the shielding structure 10 of FIG. 5) may be provided by the printed circuit board 240, a shield can (e.g., the shield can 420 of FIG. 5), and/or a nanofiber film (e.g., the nanofiber film 500 of FIG. 5), which are combined, or the arrangement relationship thereof.

In the following description of the disclosure, the shielding structure 10 described above will be described with reference to the drawings.

FIG. 5 is a cross-sectional view illustrating a shielding structure according to various embodiments.

Referring to FIG. 5, the shielding structure 10 may include a circuit board 400, a first component 401 disposed on the circuit board, a shield can 420 disposed on the circuit board to surround at least a part of the first component 401, a nanofiber film 500 disposed on the shield can 420, and a support member 300 disposed adjacent to the nanofiber film 500.

The circuit board 400 of FIG. 5 may be the same as or similar to the printed circuit board 240 of FIG. 4 in whole or in part. The support member 300 of FIG. 5 may be the same as or similar to the above-described bracket 232 or rear case 260 of FIG. 4 in whole or in part.

According to various embodiments, the shield can 420 may be disposed around the first component 401. In an embodiment, the shield can 420 may be a medium capable of transmitting electromagnetic waves (e.g., noise) generated by the first component 401. For example, the electromagnetic wave generated by the first component 401 may be transmitted to the circuit board 400 via the shield can 420. For example, the shield can 420 may be connected to the circuit board 400 having a grounding function, and absorb the electromagnetic waves generated by the first component 401 and/or a second component 402. In an embodiment, the second component 402 and the first component 401 may be arranged on the circuit board 400 in parallel to each other, and the shield can 420 may be disposed to surround both the second component 402 and the first component 401. In an embodiment, the shield can 420 may be arranged to surround the first component 401 to transmit the heat radiated from the first component 401 to the outside (e.g., the bracket 232 of FIG. 4). In the following description, the first component 401 and/or the second component 402 may refer, for example, and without limitation, to an application processor (AP) and/or a memory (e.g., the memory 130 of FIG. 1).

According to an embodiment, the shield can 420 may be made of a highly electrically conductive and/or thermally conductive material. For example, the shield can 420 may be made of a metal material. As the shield can 420 is made of a metal material, the heat or electromagnetic waves radiated from the first component 401 can be efficiently dispersed. According to various embodiments, the shield can 420 may include an opening 421. Heat may be efficiently diffused to the outside of the shield can 420 through the opening 421. In an embodiment, the opening 421 may be disposed to correspond to the position of the first component 401. For example, when the shielding structure 10 is viewed from the side (y-axis direction), the positions of the first component 401 and the opening 421 on the x-axis may correspond to each other.

According to various embodiments, the nanofiber film 500 may be arranged on the upper position (−z-axis direction) of the shield can 420. For example, at least a part of the nanofiber film 500 may be arranged to shield the opening 421.

According to various embodiments, a filling member 499 may be disposed on the first component 401. For example, the filling member 499 may be disposed at a position corresponding to the opening 421 of the shield can 420. In addition, the filling member 499 may be disposed between the first component 401 and the nanofiber film 500. In an embodiment, the heat radiated from the first component 401 may be transferred to the nanofiber film 500 via the filling member 499. According to an embodiment, the filling member 499 may be comprised of at least one of materials in a liquid state, a solid state, and a semi-solid state. The filling member 499 may be made of a material having high thermal conductivity. In an example, the filling member 499 may be a thermal interface material (TIM).

According to various embodiments, the nanofiber film 500 may transfer the heat transferred from the shield can 420 to the outside (e.g., the support member 300). The nanofiber film 500 may provide an electrical travel route for transferred the electromagnetic waves transferred from the shielded can 420. For example, the nanofiber film 500 may transfer electromagnetic waves in the horizontal direction (x-axis direction) on the shield can 420. In another example, the nanofiber film 500 may transfer electromagnetic waves from the shield can 420 disposed on one side (−x-axis direction) of the opening 421 to the shield can 420 disposed on the other side (+x-axis direction) of the opening 421.

According to various embodiments, the nanofiber film 500 may be disposed adjacent to another configuration (e.g., the bracket 232 in FIG. 4) in the electronic device (e.g., the electronic device 200 in FIG. 4). For example, the nanofiber film 500 may be disposed adjacent to the support member 300. In another example, the support member 300 may be disposed on the upper position (−z-axis direction) of the nanofiber film 500. Accordingly, the heat generated by the nanofiber film 500 may be diffused via the support member 300. The nanofiber film 500 may be disposed to be in contact with the support member 300, but it is not essential and may be disposed to be spaced a predetermined (e.g., specified) distance apart therefrom. In an embodiment, the nanofiber film 500 may be disposed adjacent to a member for heat dispersion (e.g., the heat diffusion member 320-1 in FIG. 9). For example, the heat diffusion member (e.g., the heat diffusion member 320-1 in FIG. 9) in the embodiments described in greater detail below may include at least one of a water-cooling heat diffusion member (vapor chamber), a heat pipe, a heat sink, a heat spreader, a Cu plate, a graphite sheet, and/or graphene. The heat diffusion member (e.g., the heat diffusion member 320-1 in FIG. 9) may be accommodated in the support member 300 or may be disposed between the nanofiber film 500 and the support member 300 to face each other. In the shielding structure 10 according to various embodiments, the arrangement relationship between the nanofiber film 500 and the internal elements of the electronic device (e.g., the electronic device 200 in FIG. 4) will be described in detail greater detail below with reference to FIG. 9 to FIG. 13.

According to various embodiments, the nanofiber film 500 can be compressed. For example, the shielding structure 10 needs to have a small height with respect to the vertical direction (−z-axis direction) for the space efficiency in the electronic device (e.g., the electronic device 200 of FIGS. 2 and 3), and to this end, the nanofiber film 500 may be made of a compressible material.

Figure 6:
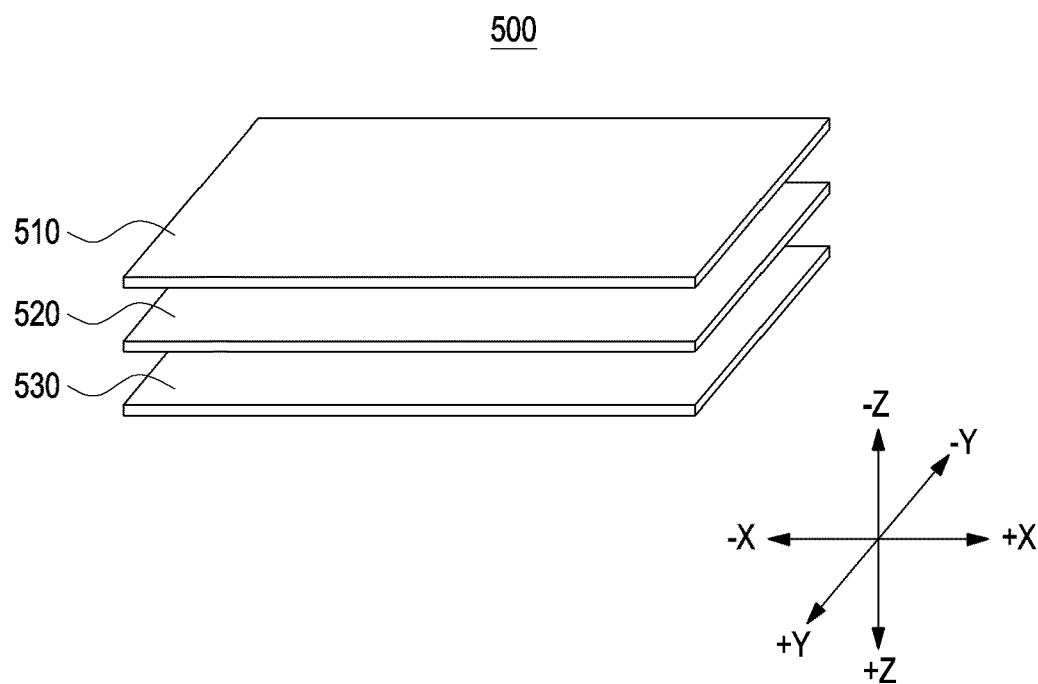
FIG. 6 is an exploded perspective view illustrating a stacked structure of a nanofiber film according to various embodiments.
Figure 7:
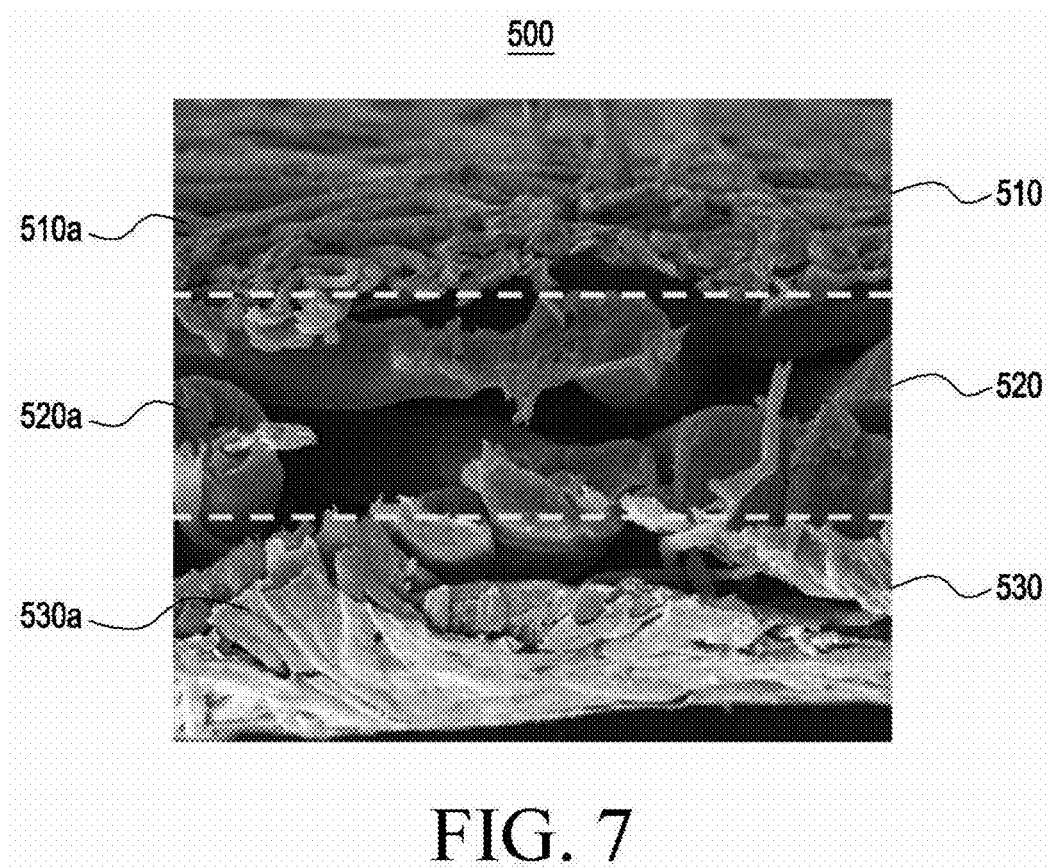
FIG. 7 is a diagram illustrating an enlarged nanofiber film according to various embodiments.

FIG. 6 is an exploded perspective view illustrating an example stacked structure of a nanofiber film 500 according to various embodiments. FIG. 7 is a diagram illustrating an enlarged nanofiber film 500 according to various embodiments.

Referring to FIG. 6 and FIG. 7, the nanofiber film 500 may include a first layer 510, a second layer 520 disposed on the first layer, and a third layer 530 disposed on the second layer. For example, the nanofiber film 500 may be described as being formed by sequentially laminating the third layer 530 to the first layer 510. Since the nanofiber film 500 of FIG. 6 may be the same as or similar to the nanofiber film 500 of FIG. 5 in whole or in part, the redundant description may not be repeated.

According to various embodiments, the nanofiber film 500 may be formed by laminating a plurality of layers having different densities. In an embodiment, all or some of the first to third layers 510, 520, and 530 may have different or the same densities. For example, the first layer 510 and the third layer 530 may be configured to have a higher density than the second layer 520 disposed between the first layer 510 and the third layer 530.

According to various embodiments, the nanofibers of each layer 510, 520, and 530 may have different thicknesses depending on each layer 510, 520, and 530, or may have substantially the same or similar thickness. For example, the thickness of the nanofibers 510a and 530a of the first layer 510 and the third layer 530 may be configured thinner than the thickness of the nanofiber 520a of the second layer 520. In another example, the thickness of the nanofiber 520a of the second layer 520 may be larger than the thickness of the nanofibers 510a and/or 530a of the first layer 510 and/or the third layer 530. In an embodiment, the thickness of the nanofibers 510a and/or 530a of the first layer 510 and/or the third layer 530 may be configured to be about 4-6 micrometers. The thickness of the nanofiber 520a of the second layer 520 may be configured to be about 17-22 micrometers.

According to various embodiments, the air permeability of all or some of each layer 510, 520, and 530 of the nanofiber film 500 may be substantially the same as or different from each other. For example, the air permeability of the first layer 510 and the third layer 530 may be smaller than the air permeability of the second layer 520. For example, the first to third layers 510, 520, and 530 of the nanofiber film 500 may be distinguished by the density, the thickness of the nanofibers 510a, 520a, and 530a of the layers, and/or the air permeability. In an embodiment, the first layer 510 and/or the third layer 530 may have an air permeability of about 20-25 $cm^3/cm^2/s$. The second layer 520 may have an air permeability of about 210-220 $cm^3/cm^2/s$. In an embodiment, as the low-density layer (the second layer 520) is disposed between the high-density layers (the first layer 510 and/or the third layer 530), the nanofiber film 500 may facilitate physical compression and restoration. As the high-density layer (the first layer 510 or the third layer 530) is arranged on the outer surface of the nanofiber film 500, the shielding performance may be improved by having low surface resistance and horizontal electrical resistance. As the low-density layer (the second layer 520) is arranged in the middle of the nanofiber film 500, it has low electrical resistance in the vertical direction and the shielding performance may be improved.

According to various embodiments, since the second layer 520 arranged in the middle of the nanofiber film 500 may have a lower density than the first layer 510 and/or the third layer 530 arranged on the outer surface of the nanofiber film 500, when the nanofiber film 500 is compressed, the second layer 520 may be deformed more than the first layer 510 and/or the third layer 530.

According to various embodiments, a conductive material may be plated on the nanofiber film 500. In an embodiment, the conductive material may be a metal material. For example, the conductive material may include at least one or more of copper (Cu), zinc (Zn), aluminum (Al) or silver (Ag).

According to various embodiments, an adhesive material may be disposed on the first layer 510. In an embodiment, the adhesive material may include pressure-sensitive adhesive (PSA). The adhesive material may be configured in solid state, liquid state, or semi-solid state. In an embodiment, the adhesive material may be coated on the first layer 510. In an embodiment, as the adhesive material is disposed on the first layer 510, as will be described in greater detail below, the thermal resistance between the first layer 510 and the support member (e.g., the support member 300 in FIG. 5) or the heat diffusion member (e.g., the heat diffusion member 320-1 in FIG. 9) may be reduced.

According to various embodiments, a conductive adhesive material may be disposed on the third layer 530. In an embodiment, the conductive adhesive material may include a conductive filler. For example, the conductive adhesive material may be a pressure-sensitive adhesive (PSA) mixed with a conductive filler. In an embodiment, the conductive filler may include a carbon-based (C) material. For example, a carbon-based (C) conductive filler may include carbon black, carbon fiber and/or graphite. In an embodiment, the conductive filler may include a metal-based material. For example, a metal-based conductive filler may include all or some of silver (Ag), copper (Cu), nickel (Ni), zinc oxide (ZnO), tin oxide (SnO), aluminum (Al), and/or stainless steel. In an embodiment, the conductive filler may be made of synthetic fibers. However, this is merely an example and conductive fillers made of various materials may be used.

Figures 8A, 8B:
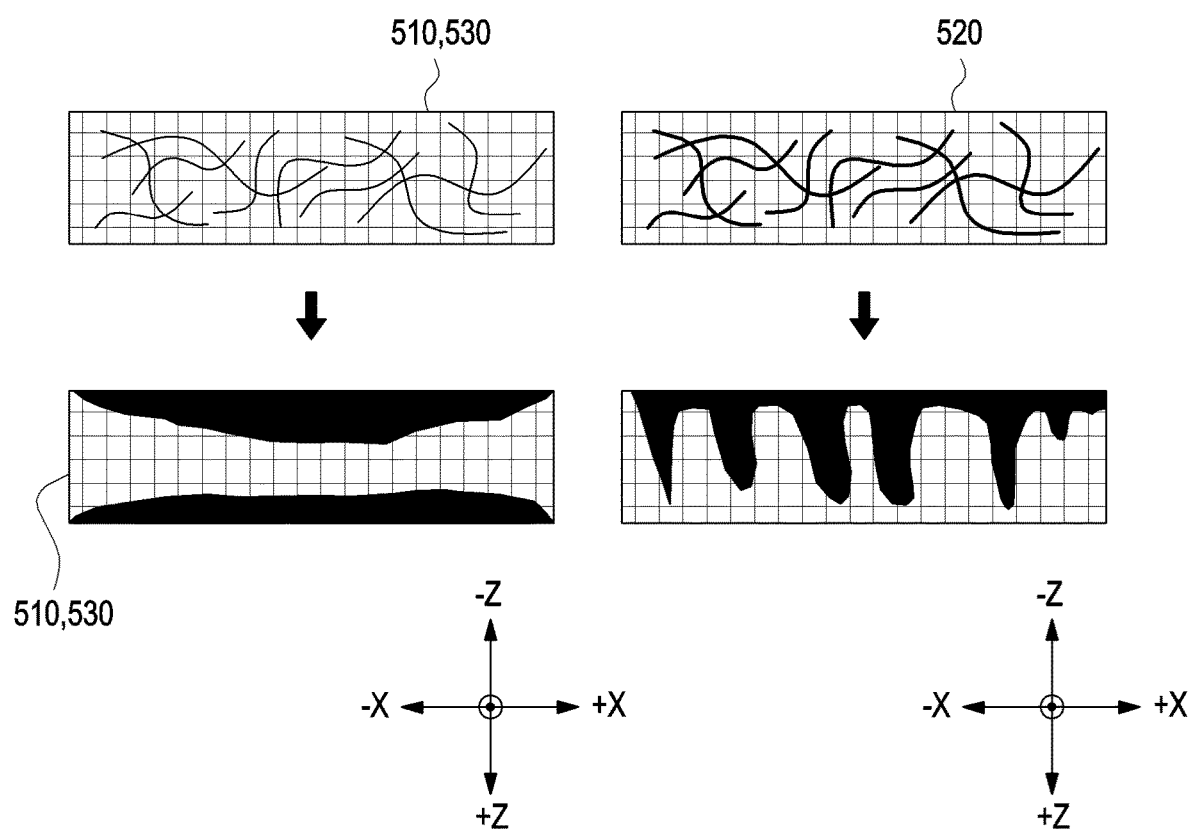
FIGS. 8A and 8B are diagrams illustrating a conductive material plated on a nanofiber film according to various embodiments.

FIGS. 8A and 8B are diagrams illustrating a conductive material plated on a nanofiber film according to various embodiments. FIG. 8A illustrates a plating direction of the first layer and/or the third layer according to various embodiments. FIG. 8B illustrates a plating direction of the second layer according to various embodiments.

Referring to FIGS. 8A and 8B, a conductive material may be plated on the nanofiber film 500. The description of the nanofiber film 500 in the above-described embodiment may be applicable to the nanofiber film 500 of FIGS. 8A and 8B.

According to various embodiments, as described above, all or part of the first layer 510, the second layer 520, and the third layer 530 may have the same or different fiber densities. Accordingly, the plating direction of the conductive material may correspond to the respective fiber densities of the first layer 510 to the third layer 530 or the thickness of the nanofibers thereof.

For example, the second layer 520 may have a relatively low fiber density as compared to the first layer 510 and/or the third layer 530, and accordingly, in the second layer 520, a plating solution may be arranged so as to be superior in the vertical direction as compared with the first layer 510 and/or the third layer 530. In another example, the first layer 510 and/or the third layer 530 may have a relatively high fiber density as compared to the second layer 520, and accordingly, in the first layer 510 and/or the third layer 530, a plating solution may be arranged so as to be superior in the horizontal direction as compared with the second layer 520

According to various embodiments, each layer 510, 520, and 530 of the nanofiber film 500 may have different electrical resistance depending on the direction. In an embodiment, the electrical resistance of each layer 510, 520, and 530 may correspond to the fiber density of each layer 510, 520, and 530 or may correspond to the thickness of the nanofibers of each layer 510, 520, and 530. For example, as described above, since the first layer 510 and/or the third layer 530 have a relatively thin fiber thickness compared to the second layer 520, as compared with the second layer 520, the electric material is plated in the horizontal direction (x-axis direction) so that the electrical resistance is lower in the horizontal direction (x-axis direction). In another example, since the second layer 520 have a relatively thick fiber thickness compared to the first layer 510 and/or the third layer 530, the second layer 520 may have a relatively low electrical resistance in the vertical direction (z-axis direction) as compared to the first layer 510 and/or the third layer 530. For example, it can be expressed that the first layer 510 and/or the third layer 530 has better conductivity in the horizontal direction (x-axis direction) as compared with the second layer 520, and the second layer 520 has better conductivity in the vertical direction (z-axis direction) as compared with the first layer 510 and/or the third layer 530. Accordingly, the first layer 510 and/or the third layer 530 may transfer the electromagnetic wave generated by the first component 401 in the horizontal direction (x-axis direction), and the second layer 520 may provide an electrical movement path in the vertical direction (z-axis direction) between the first layer 510 and the third layer 530.

According to various embodiments, the nanofiber film 500 plated with a conductive material may provide a path through which noise generated in the first component (e.g., first component 401 in FIG. 5) is transmitted. In the description, FIG. 5 may be referred to together.

In an embodiment, the second layer 520 may electrically connect the third layer 530 and the first layer 510. For example, as described above, in the second layer 520, the plating solution may be relatively arranged in the vertical direction (z-axis direction) so that the noise transmitted to the first layer 510 passes through the second layer 520 and is transmitted to the third layer 530. In addition, the nanofiber film 500 may be compressed in the vertical direction (z-axis direction) in the assembly process, and accordingly, the second layer 520 comes into close contact with the first layer 510 and/or the third layer 530 so that the conductivity between the first layer 510 and the third layer 530 can be improved.

According to various embodiments, the first layer 510 and/or the third layer 530 may provide a path for noise to be transmitted in the horizontal direction (x-axis direction). In an embodiment (referring to FIG. 5 together), only part of the plurality of layers 510, 520, and 530 may be formed in a partial region of the nanofiber film 500, for example, the region of the nanofiber film 500 corresponding to the opening 421. For example, only the first layer 510 may be formed in a partial region of the nanofiber film 500 corresponding to the opening 421. The first layer 510 may be in contact with the first component 401 directly or via the filling member 499, and the electromagnetic wave transmitted to the first layer 510 may be diffused in the horizontal direction (x-axis direction). As described above, the electromagnetic wave may be transmitted from the first layer 510 to the third layer 530 via the second layer 520, and may be diffused via the shield can 420 in contact with the third layer 530.

FIGS. 9, 10, 11, 12 and FIG. 13 (which may be referred to as FIG. 9 to FIG. 13) are cross-sectional views illustrating various examples of the shielding structure and the support member (heat diffusion member) according to various embodiments. However, the examples illustrated FIG. 9 to FIG. 13 merely express a part of the various embodiments of the disclosure with drawings, and the disclosure should not be construed to be limited to these example embodiments.

Figure 9:
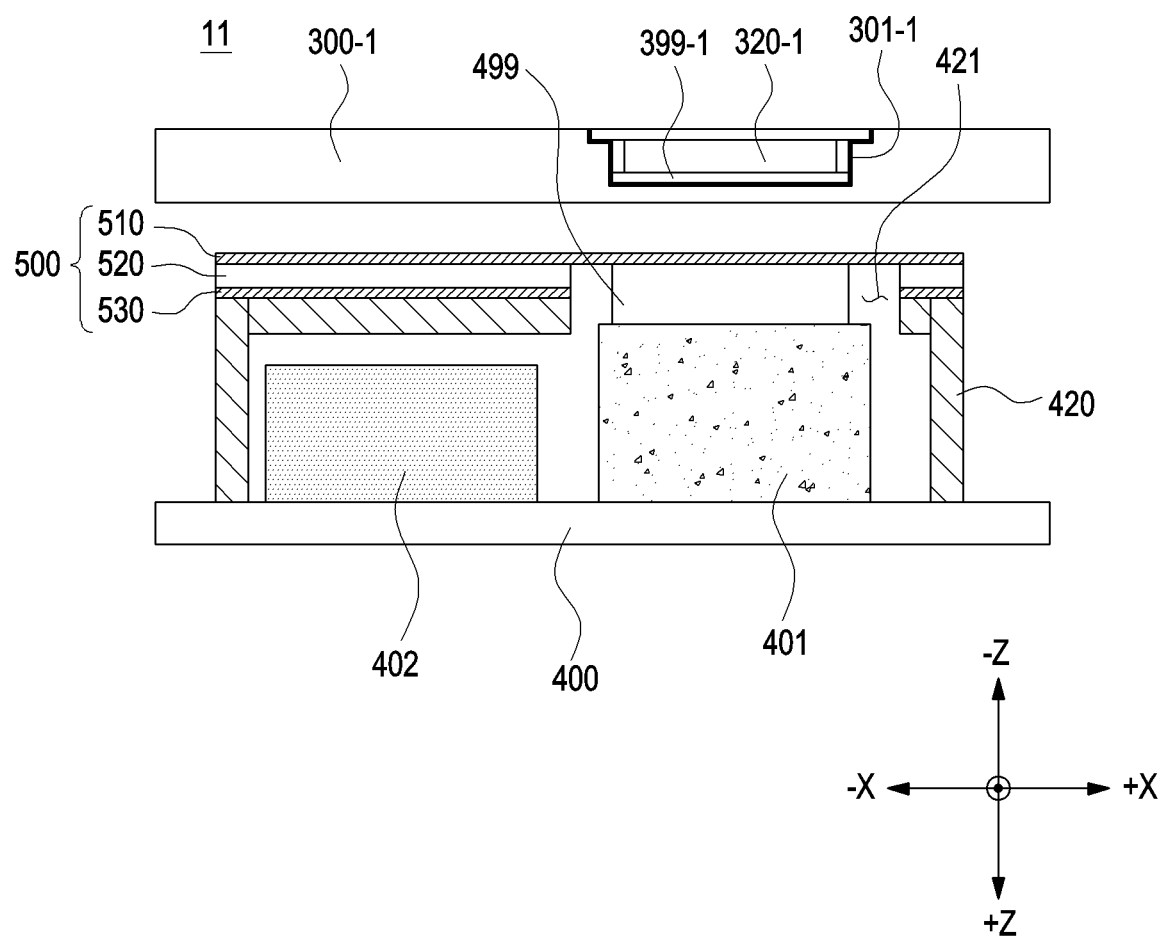
FIG. 9 is a cross-sectional view illustrating a shielding structure according to various embodiments.

FIG. 9 is a cross-sectional view illustrating an example shielding structure according to various embodiments.

Referring to FIG. 9, the shielding structure 11 may include all or some of a nanofiber film 500, a circuit board 400, a first component 401, a second component 402, a shield can 420, a support member 300-1 and/or a heat diffusion member 320-1. The description of the elements of the above-described shielding structure 10 in FIG. 5 may be applicable to the description of each element illustrated in FIG. 9.

According to various embodiments, the support member 300-1 may be arranged on the upper position of the shielding structure 11 (the −z-axis direction). In an embodiment, the heat diffusion member 320-1 may be arranged on the support member 300-1. For example, the support member 300-1 may include an accommodation region 301-1 and the heat diffusion member 320-1 may be arranged in the accommodation region 301-1. In another example, an auxiliary filling member 399-1 may be disposed in the lower position (the +z-axis direction, for example, between the accommodation region 301-1 and the heat diffusion member 320-1) of the heat diffusion member 320-1.

According to various embodiments, the heat diffusion member 320-1 may be disposed to face the nanofiber film 500 with the support member 300-1 interposed therebetween. For example, the heat diffusion member 320-1 may be disposed to face the first layer 510 with the support member 300-1 interposed therebetween.

In an embodiment, the heat generated in the first component 401 and/or the second component 402 may be transferred to the nanofiber film 500 via the filling member 499, and may be transferred from the nanofiber film 500 to the support member 300-1 and/or the heat diffusion member 320-1. As described above, the filling member 499 may be disposed to correspond to the opening 421 of the shield can 420.

In an embodiment, the electromagnetic waves generated by the first component 401 and/or the second component 402 may be dispersed in the horizontal direction (x-axis direction) via the first layer 510, and the electromagnetic wave transmitted to the third layer 530 via the second layer 520 may be transmitted to the circuit board 400 via the shield can 420.

Figure 10:
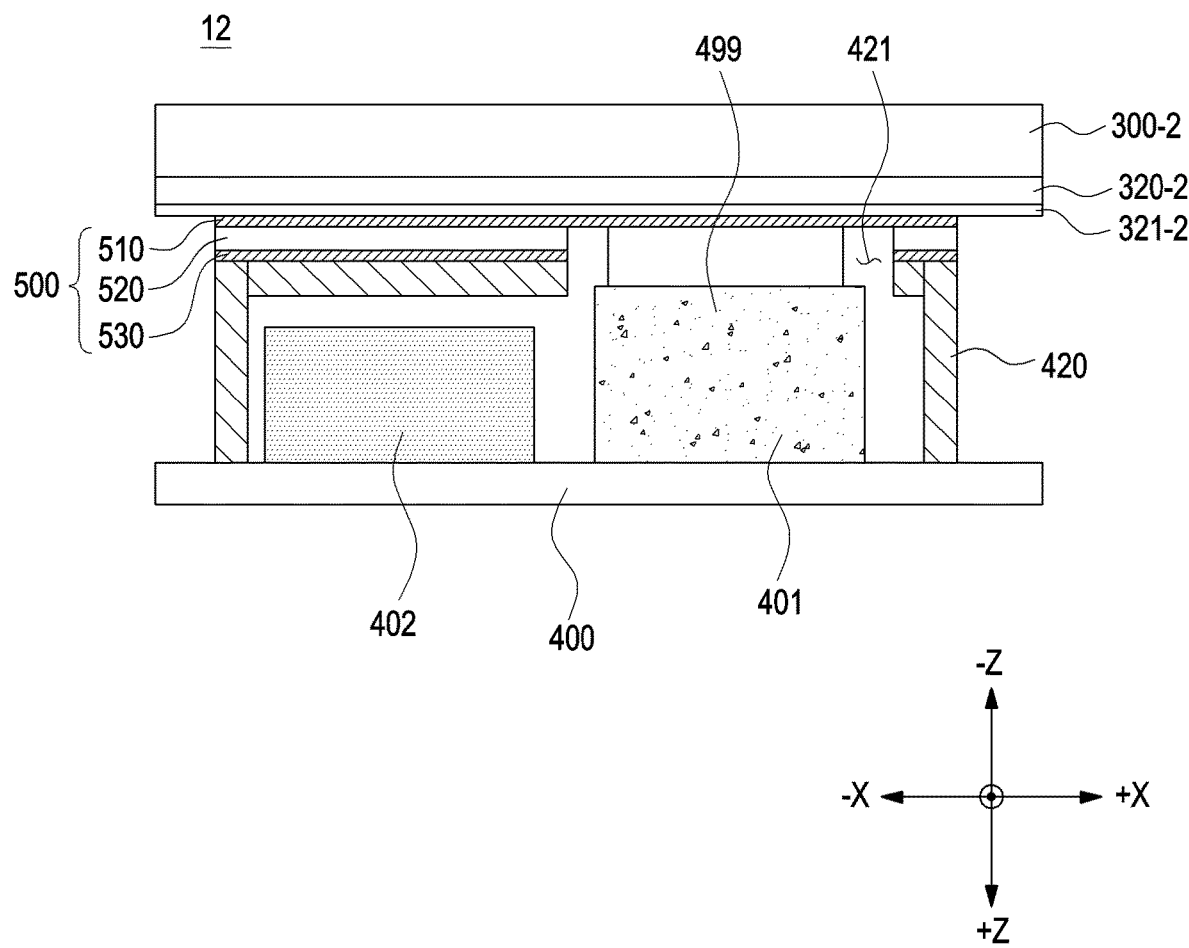
FIG. 10 is a cross-sectional view illustrating a shielding structure according to various embodiments.

FIG. 10 is a cross-sectional view illustrating an example shielding structure according to various embodiments.

Referring to FIG. 10, the shielding structure 12 may include all or some of a nanofiber film 500, a circuit board 400, a first component 401, a second component 402, a shield can 420, a support member 300-2, a heat diffusion member 320-2 disposed adjacent to the support member 300-2, and a shielding film 321-2. The description of the elements of the above-described shielding structures 10 and 11 in FIG. 5 and FIG. 9 may be applicable to the description of each element illustrated in FIG. 10.

According to various embodiments, the heat diffusion member 320-2 may be arranged in the lower position (the +z-axis direction) of the support member 300-2. The shielding film 321-2 may be arranged in the lower position (the +z-axis direction) of the heat diffusion member 320-2. In an embodiment, the shielding film 321-2 may function to shield noise generated in the first component 401 and/or the second component 402, and may be made of a highly electrically conductive material. For example, the shielding film 321-2 may be made of a metal sheet. For example, the shielding film 321-2 may be a copper sheet (Cu sheet), but is not limited thereto, and various members capable of performing the same function may be used.

According to various embodiments, the shielding film 321-2 and the nanofiber film 500 may be arranged to face each other. For example, the first layer 510 and the shielding film 321-2 may be arranged to face each other. In an embodiment, the first layer 510 and the shielding film 321-2 may be arranged to be in contact with each other. However, it is not limited thereto, and the first layer 510 and the shielding film 321-2 may be arranged to be spaced a predetermined distance apart from each other.

In an embodiment, the electromagnetic waves generated from the first component 401 and/or the second component 402 may be transmitted from the first layer 510 to the shielding film 321-2. The electromagnetic wave transmitted to the shielding film 321-2 may be dispersed in the horizontal direction (x-axis direction). In an embodiment, the heat generated from the first component 401 and/or the second component 402 may be dispersed to the heat diffusion member 320-2 via the shielding film 321-2.

With respect to the process of dispersing heat or electromagnetic waves via the first to third layers 510, 520, and 530, the filling member 499, and the shield can 420, the contents about the shielding structure 10 and 11 in the various above-described embodiments may be applicable.

Figure 11:
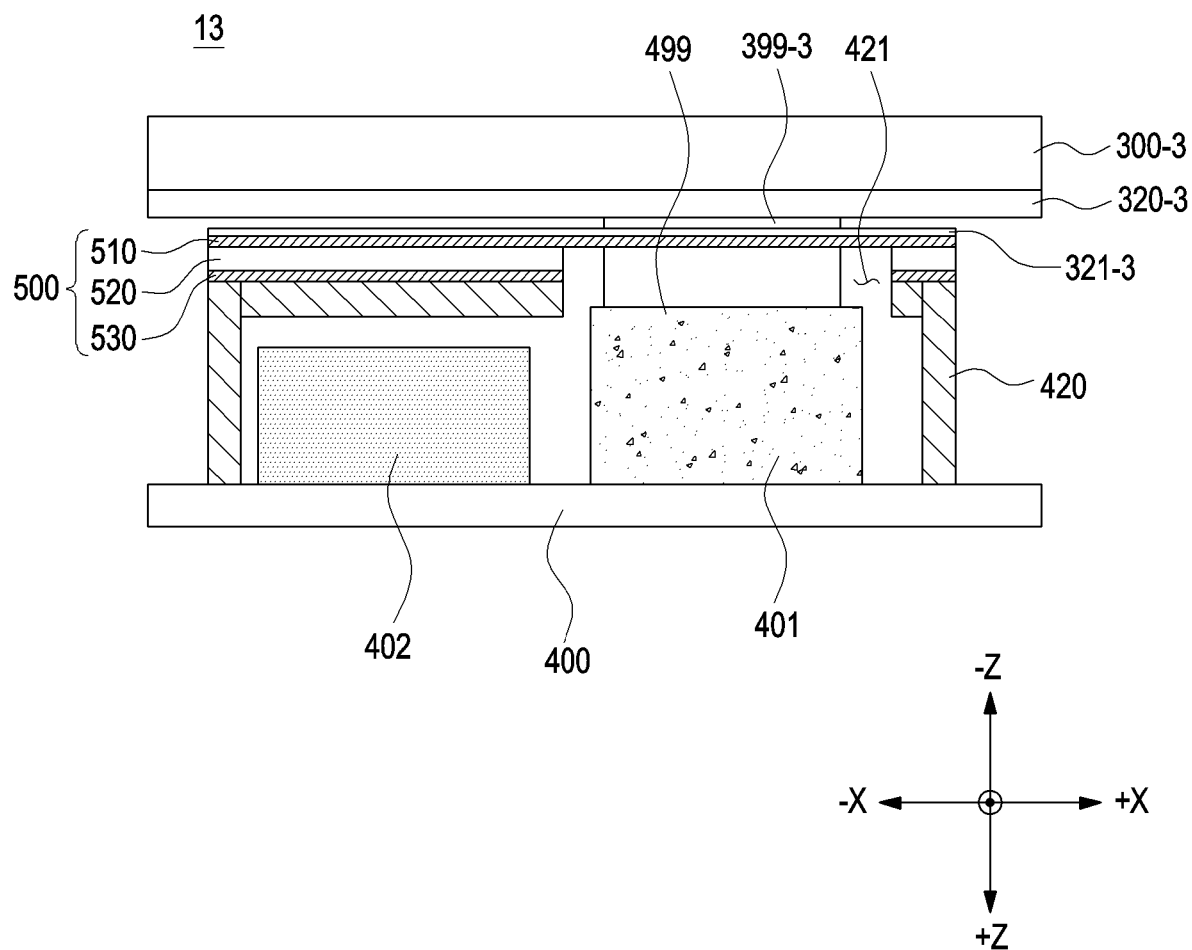
FIG. 11 is a cross-sectional view illustrating a shielding structure according to various embodiments.

FIG. 11 is a cross-sectional view illustrating an example shielding structure according to various embodiments.

Referring to FIG. 11, the shielding structure 13 may include all or some of a nanofiber film 500, a shielding film (321-3) disposed adjacent to the nanofiber film 500, a circuit board 400, a first component 401, a second component 402, a shield can 420, a support member 300-3, and a heat diffusion member 320-3 disposed adjacent to the support member 300-3. The description of the elements of the above-described shielding structures 10, 11, and 12 in FIG. 5, FIG. 9, and FIG. 10 may be applicable to the description of each element illustrated in FIG. 11.

According to various embodiments, the shielding film 321-3 may be disposed adjacent to the nanofiber film 500. For example, the shielding film 321-3 may be disposed on the upper position (the −z-axis direction) of the first layer 510. In an embodiment, the shielding film 321-3 may shield the electromagnetic waves generated by the first component 401 and/or the second component 402 on the first layer 510.

According to various embodiments, the heat diffusion member 320-3 may be disposed in the lower position (the +z-axis direction) of the support member 300-3. In an embodiment, the heat diffusion member 320-3 may be disposed to face the shielding film 321-3.

According to an embodiment, an auxiliary filling member 399-3 may be disposed in the lower position (the +z-axis direction) of the heat diffusion member 320-3. For example, the auxiliary filling member 399-3 may be disposed between the heat diffusion member 320-3 and the shielding film 321-3. In an embodiment, the auxiliary filling member 399-3 may be disposed only in a partial region of the heat diffusion member 320-3. For example, the auxiliary filling member 399-3 may be disposed in a partial region of the heat diffusion member 320-3 corresponding to the opening 421 when the shielding structure 13 is viewed from the side. In an embodiment, the auxiliary filling member 399-3 may be disposed entirely on the heat diffusion member 320-3. In an embodiment, the auxiliary filling member 399-3 may mediate the heat transfer between the heat diffusion member 320-3 and the shielding film 321-3 on the upper position of the nanofiber film 500.

Figure 12:
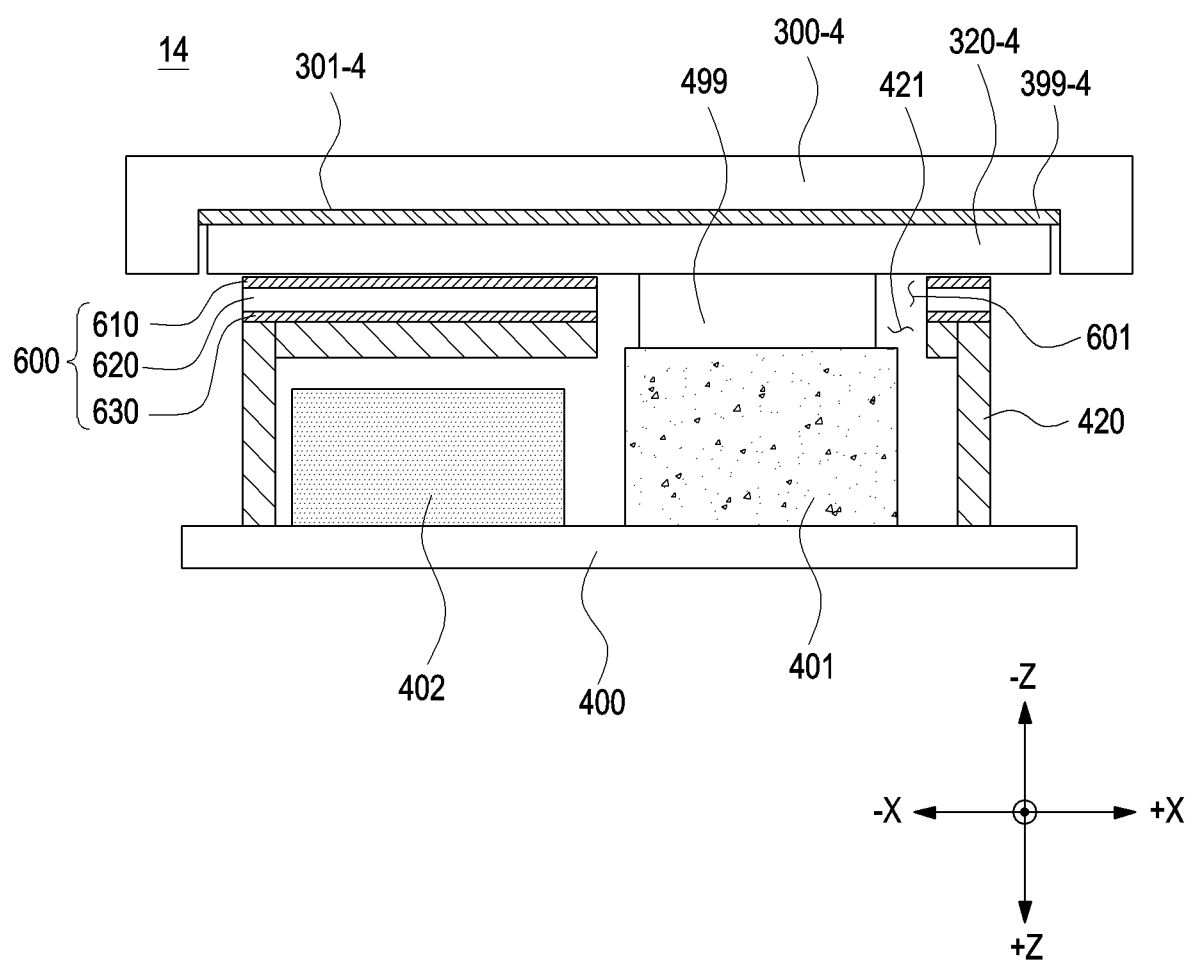
FIG. 12 is a cross-sectional view illustrating a shielding structure according to various embodiments.

FIG. 12 is a cross-sectional view illustrating an example shielding structure according to various embodiments.

Referring to FIG. 12, the shielding structure 14 may include all or some of a nanofiber film 600, a circuit board 400, a first component 401, a second component 402, a shield can 420, a support member 300-4, and a heat diffusion member 320-4 disposed adjacent to the support member 300-4. The description of the elements of the above-described shielding structures 10, 11, 12, and 13 in FIG. 5 and FIG. 9 to FIG. 11 may be applicable to the description of each element illustrated in FIG. 12.

According to various embodiments, the nanofiber film 600 may include an auxiliary opening 601. In an embodiment, the auxiliary opening 601 may be disposed at a position corresponding to the opening 421 disposed in the shielded can 420.

According to various embodiments, the support member 300-4 may include an accommodation region 301-4 formed in the lower position (+z-axis direction) thereof. In an embodiment, the heat diffusion member 320-4 may be accommodated in the accommodation region 301-4 and may be disposed adjacent to the nanofiber film 600. In an embodiment, the heat diffusion member 320-4 may be disposed to be in contact with the nanofiber film 600. For example, the heat diffusion member 320-4 may be disposed on the first layer 610. In another example, the heat diffusion member 320-4 may be disposed to shield the auxiliary opening 601. In an embodiment, as described above, the second layer 620 and the third layer 630 may be arranged in the lower position (+z-axis direction) of the first layer 610 in order.

According to various embodiments, the filling member 499 may be disposed between the first component 401 and the heat diffusion member 320-4. For example, the filling member 499 may be disposed in a region corresponding to the opening 421 and the auxiliary opening 601 when the shielding structure 14 is viewed from the side. In an embodiment, one side (+z-axis direction) of the filling member 499 may be disposed to be in contact with the first component 401, and the other side (−z-axis direction) may be disposed to be in contact with the heat diffusion member 320-4. Therefore, the heat generated in the first component 401 may be dispersed to the heat diffusion member 320-4 via the filling member 499.

According to an embodiment, the auxiliary filling member 399-4 may be disposed between the accommodation region 301-4 and the heat diffusion member 320-4. For example, the auxiliary filling member 399-4 may be disposed on the upper position (the −z-axis direction) of the heat diffusion member 320-4. The heat transferred to the heat diffusion member 320-4 via the auxiliary filling member 399-4 may be dispersed.

Figure 13:
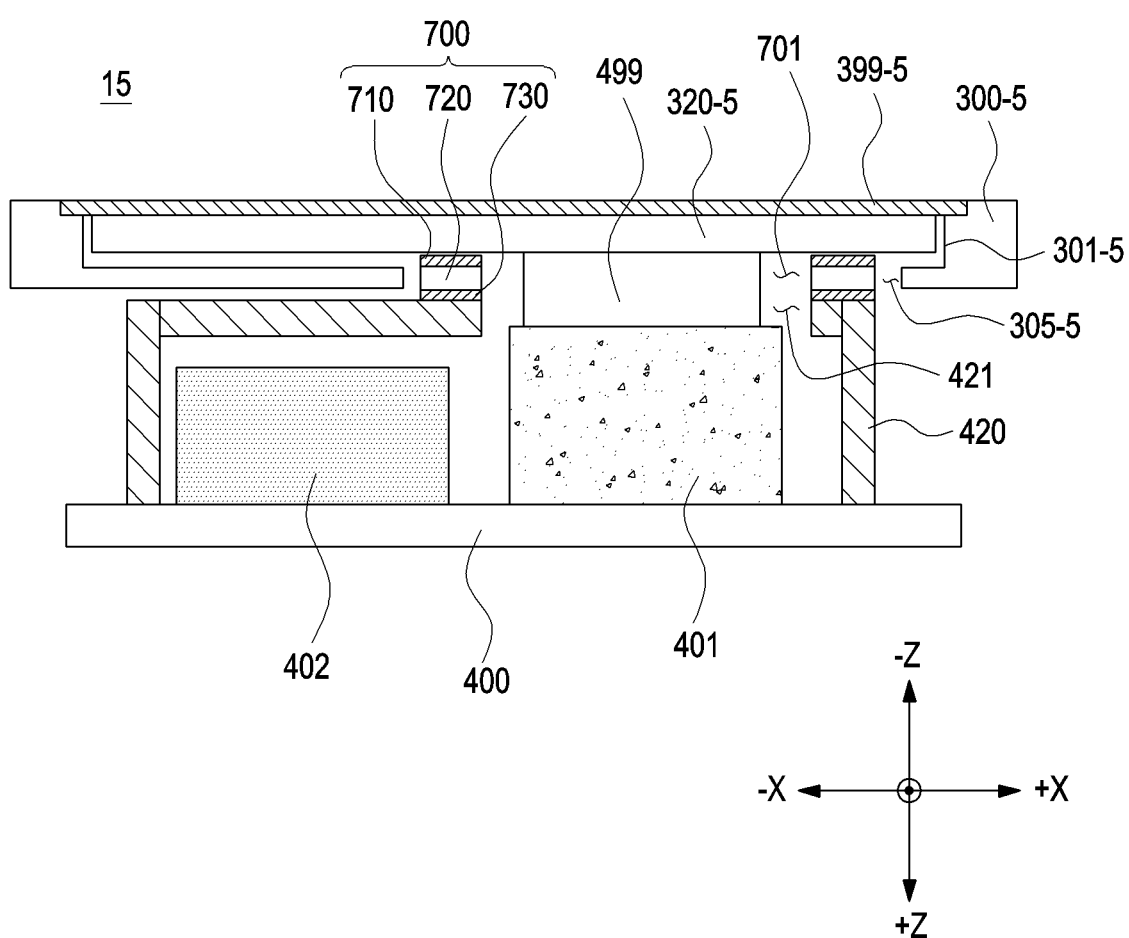
FIG. 13 is a cross-sectional view illustrating a shielding structure according to various embodiments.

FIG. 13 is a cross-sectional view illustrating an example shielding structure according to various embodiments.

Referring to FIG. 13, a shielding structure 15 may include all or some of a nanofiber film 700, a circuit board 400, a first component 401, a second component 402, a shield can 420, a support member 300-5, and a heat diffusion member 320-5 disposed adjacent to the support member 300-5. The description of the elements of the above-described shielding structures 10, 11, 12, 13, and 14 in FIG. 5 and FIG. 9 to FIG. 12 may be applicable to the description of each element illustrated in FIG. 13.

According to various embodiments, the support member 300-5 may include an accommodation region 301-5. In an embodiment, the accommodation region 301-5 may be formed as a recess in the support member 300-5. For example, the heat diffusion member 320-5 may be disposed in the accommodation region 301-5.

According to various embodiments, the support member 300-5 may include an accommodation opening 305-5. For example, the accommodation opening 305-5 may be disposed in the lower position (+z-axis direction) of the accommodation region 301-5. According to an embodiment, the accommodation opening 305-5 may accommodate the nanofiber film 700. For example, the width of the accommodation opening 305-5 may be configured to be larger than the width of the nanofiber film 700. In an embodiment, a part (e.g., the first layer 710) of the nanofiber film 700 inserted through the receiving opening 305-5 may come into contact with the heat diffusion member 320-5. Accordingly, the electromagnetic waves generated by the first component 401 and/or the second component 402 may be dispersed via the heat diffusion member 320-5 and/or the nanofiber film 700.

According to various embodiments, the nanofiber film 700 may be disposed around the opening 421. For example, when the shielding structure 15 is viewed from the side, the nanofiber film 700 may be disposed on (in the −z-axis direction) all or part of the shield can 420 to surround the opening 421. In another example, the first layer 710 may be disposed to be in contact with the heat diffusion member 320-5, and the third layer 730 may be disposed to be in contact with the shield can 420. In an embodiment, the second layer 720 may be disposed between the first layer 710 and the third layer 730.

According to various embodiments, the nanofiber film 700 may include an auxiliary opening 701. The auxiliary opening 701 may be formed to penetrate the first layer 710, the second layer 720, and the third layer 730. In an embodiment, the auxiliary opening 701 may be formed to correspond to the opening 421. For example, the width of the auxiliary opening 701 may correspond to the width of the opening 421. The nanofiber film 700 may be disposed such that the auxiliary opening 701 and the opening 421 correspond to each other.

According to various embodiments, the heat diffusion member 320-5 and the nanofiber film 700 may come into contact with each other. For example, the first layer 710 may come into contact with the heat diffusion member 320-5. In an embodiment, the filling member 499 may be disposed between the first component 401 and the heat diffusion member 320-5. In an example, when the shielding structure 15 is viewed from the side, the filling member 499 may be disposed in the region corresponding to the opening 421 and the auxiliary opening 701. In another example, the filling member 499 may have one side (+z-axis direction) in contact with the first component 401, and the other side (−z-axis direction) in contact with the heat diffusion member 320-5 so as to disperse the heat generated by the first component 401 to the heat diffusion member 320-5. In an embodiment, an auxiliary filling member 399-5 may be disposed on the upper position (−z-axis direction) of the heat diffusion member 320-5. The heat generated inside the shield can 420 may be diffused to the outside via the auxiliary filling member 399-5.

Hereinafter, an example manufacturing process for the nanofiber film according to various embodiments will be described in greater detail with reference to FIG. 14 and FIG. 15.

Figure 14:
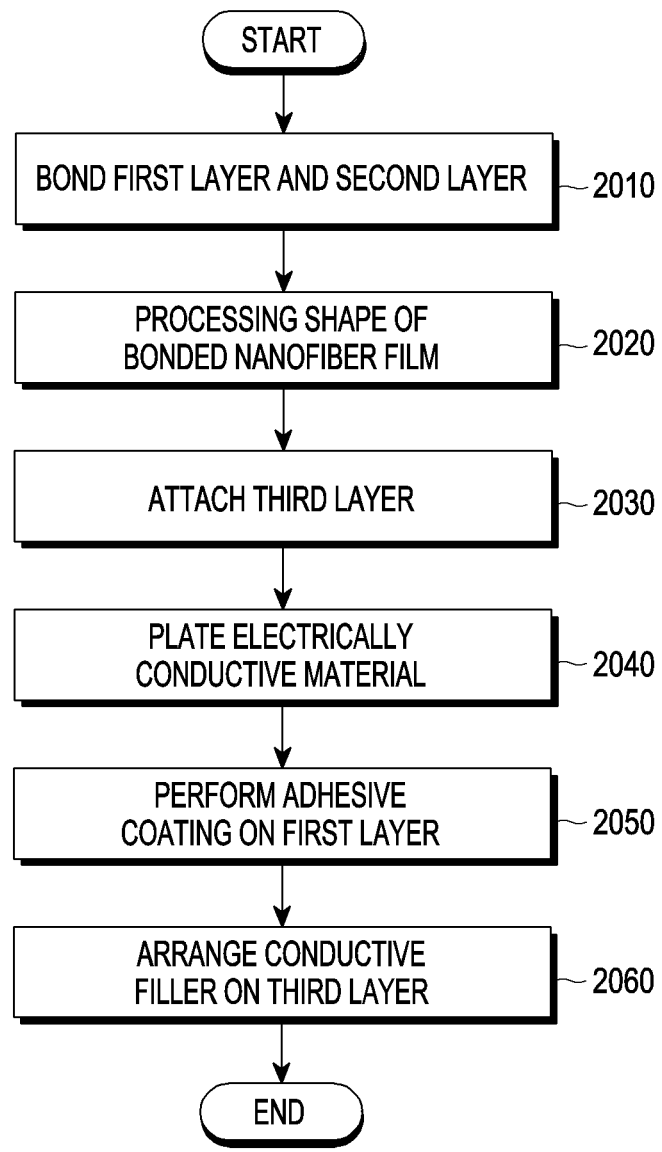
FIG. 14 is a flowchart illustrating an example manufacturing process for a nanofiber film according to various embodiments.

FIG. 14 is a flowchart illustrating an example manufacturing process for a nanofiber film according to various embodiments. FIGS. 15A, 15B, 15C, 15D, 15E and 15F (which may be referred to as FIG. 15A to FIG. 15F) are various views illustrating an example manufacturing process for a nanofiber film according to various embodiments.

Referring to FIG. 14 and FIG. 15A to FIG. 15F, a manufacturing process for a nanofiber film 1100 may include a step 2010 of bonding a first layer 1110 and a second layer 1120, a step 2020 of processing the shape of the bonded nanofiber film 1100b, a step 2030 of attaching a third layer 1130 thereto, a step 2040 of plating conductive materials, a step 2050 of performing adhesive coating on the first layer 1110, and a step 2060 of arranging the conductive filler on the third layer 1130.

According to various embodiments (referring to FIG. 14 and FIG. 15A), first, the first layer 1110 and the second layer 1120 may be bonded (2010). For example, the nanofiber film 1100b may be configured by bonding the first layer 1110 on which the nanofibers are formed at a relatively high density and the second layer 1120 on which the nanofibers are formed at a relatively low density. For example, an upper surface of the second layer 1120 may be bonded to a lower surface of the first layer 1110. According to various embodiments (referring to FIG. 14 and FIG. 15B), at least a part of the nanofiber film 1100b in which the first layer 1110 and the second layer 1120 are bonded may be processed in shape (2020). In an embodiment, the nanofiber film 1100b may be processed such that an opening 1101 is disposed in at least a part thereof. The opening 1101 may be formed to penetrate all or part of the first layer 1110 and/or the second layer 1120. For example, the nanofiber film 1100b may be subjected to a punching process. In an embodiment, the shape of the opening 1101 may correspond to the shape of the opening 421 of the shield can 420 described above.

According to various embodiments (referring to FIG. 14 and FIG. 15C), the third layer 1130 may be bonded to the nanofiber film 1100c in which the opening 1101 is formed (2030). According to an embodiment, the third layer 1130 may be arranged in the lower position (the +z-axis direction) of the second layer 1120. For example, an upper surface of the third layer 1130 may be bonded to a lower surface of the first layer 1110. In another example, the third layer 1130 may be arranged to face the first layer 1110 with respect to the second layer 1120. According to an embodiment, as described above, the third layer 1130 may also be shaped in the same manner as the first layer 1110 and/or the second layer 1120.

According to various embodiments (referring to FIG. 14 and FIG. 15D), conductive materials 1199a, 1199b, and 1199c may be plated on the nanofiber film 1100d in which the first layer 11010 to the third layer 1130 are bonded (2040). Examples of conductive materials are as described above. In an embodiment, as described above, the first layer 1110 and/or the third layer 1130 may be plated to have better electrical conductivity in the horizontal direction (x-axis or y-axis direction) as compared with the second layer 1120. In an embodiment, the second layer 1120 may be plated to have better electrical conductivity in the vertical direction (z-axis direction) as compared with the first layer 1110 and/or the third layer 1130. In another example, the first conductive material 1199a and/or the third conductive material 1199c may be arranged on the first layer 1110 and/or the third layer 1130 so as to spread in the horizontal direction (x-axis or y-axis direction). The second conductive material 1199b may be arranged on the second layer 1120 in the vertical direction (z-axis direction).

According to various embodiments (referring to FIG. 14 and FIG. 15E), an adhesive coating may be performed to the first layer 1110 (2050). For example, an adhesive coating material 1111 may be disposed on the first layer 1110. As described above, the adhesive coating material 1111 may include a pressure-sensitive adhesive (PSA) and may be formed in a liquid state or a semi-solid state. An adhesive coating may be performed to the first layer 1110 to provide a nanofiber film 1100e having an adhesive-coated surface.

According to various embodiments (referring to FIG. 14 and FIG. 15F), the third layer 1130 may be coated with a conductive adhesive material 1131 (2060). The conductive adhesive material 1131 may be arranged on the third layer 1130 so as to provide a nanofiber film 1100f having conductivity on the lower surface (+z-axis direction). As described above, the conductive adhesive material 1131 may include a conductive filler. For example, the conductive adhesive material 1131 may be a pressure-sensitive adhesive mixed with a conductive filler. In an embodiment, the conductive filler may include a carbon-based (C) material. For example, the carbon-based (C) conductive filler may include carbon black, carbon fiber and/or graphite. In an embodiment, the conductive filler may include a metal-based material. The metal-based conductive filler may include all or some of silver (Ag), copper (Cu), nickel (Ni), zinc oxide (ZnO), tin oxide (SnO), aluminum (Al), and/or stainless steel. In an embodiment, the conductive filler may be made of synthetic fibers. However, this is merely an example and conductive fillers made of various materials which can achieve the spirit of the disclosure may be used.

Figure 16:
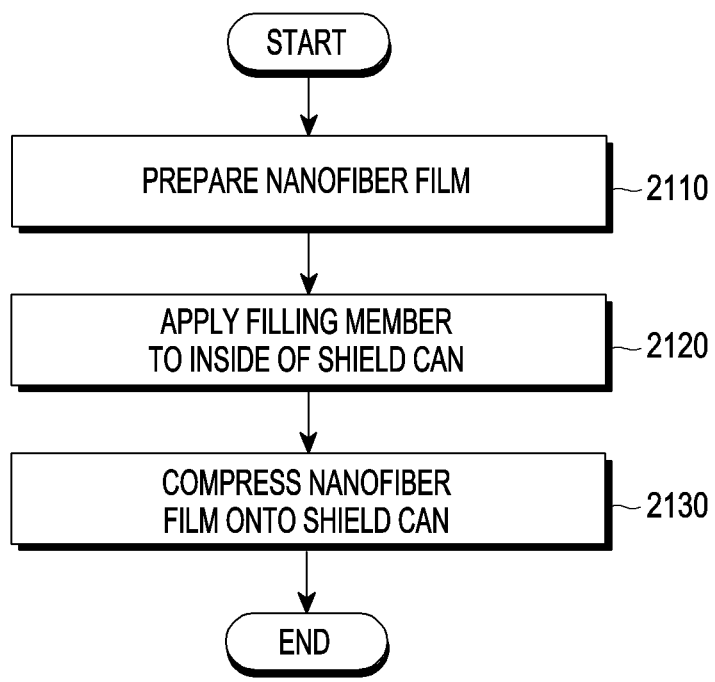
FIG. 16 is a flowchart illustrating an example assembling process for a shielding structure according to various embodiments.
Figure 17A:
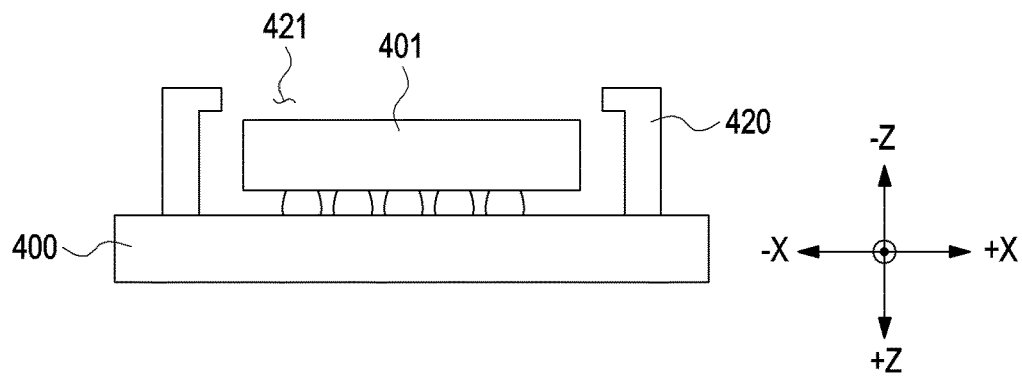
FIGS. 17A, 17B and 17C are diagrams illustrating an example assembling process for a shielding structure according to various embodiments.
Figure 17B:
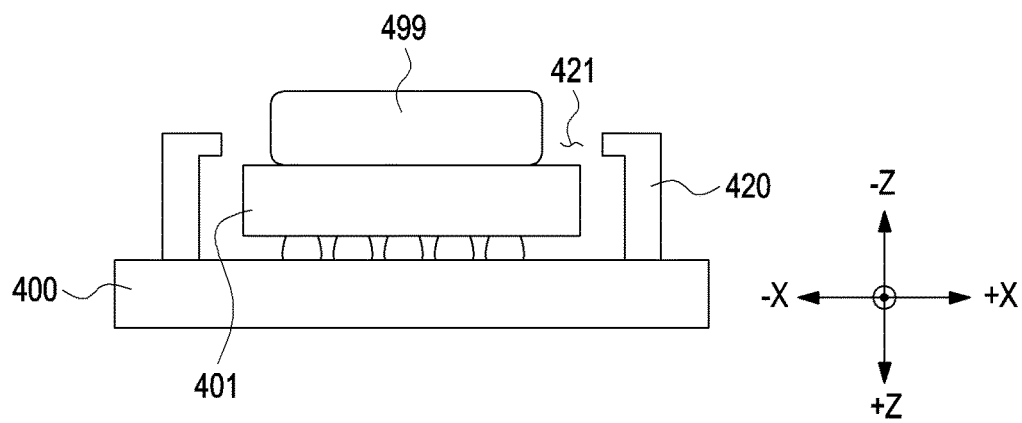
Figure 17C:
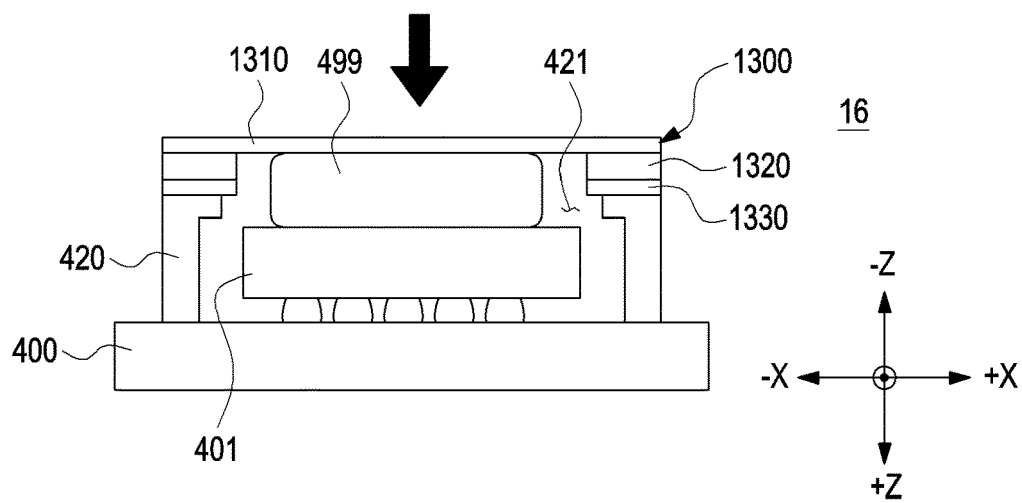

FIG. 16 and FIGS. 17A, 17B and 17C illustrate an assembling process of the shield structure according to various embodiments. FIG. 16 is a flowchart illustrating an example assembling process for a shielding structure according to various embodiments. FIGS. 17A, 17B and 17C (which may be referred to as FIG. 17A to FIG. 17C) are cross-sectional views illustrating an example assembling process for a shielding structure according to various embodiments.

Referring to FIG. 16 and FIGS. 17A to 17C, an assembling process for a shielding structure may include a step 2110 of preparing a nanofiber film 1300, a step 2120 of applying the filling member 499 to the inside of the shield can 420, and a step 2130 of compressing the nanofiber film onto the shield can.

According to various embodiments, the nanofiber film 1300 used for a shielding structure 16 may be identical or similar in whole or in part to the nanofiber film (e.g., the nanofiber film 500, 600, and 700) in the above-described embodiments. All or part of description of the shielding structures (e.g., the shielding structures 10, 11, 12, 13, 14, and 15) in the above-mentioned embodiments may be applicable to the shielding structure 16.

According to various embodiments (referring to FIG. 16 and FIGS. 17A and 17B), the filling member 499 may be disposed on the upper position of the first component 401 (2110). As described above, the filling member 499 may diffuse the heat generated by the first component 401 to the outside. According to an embodiment, when the shielding structure 16 is viewed from the side (in a direction parallel to the y axis), the filling member 499 may be disposed to protrude upward (the −z axis direction) of the opening 421.

According to various embodiments (referring to FIG. 16 and FIG. 17C), the nanofiber film 1300 may be disposed on the upper position of the shield can 420. As described above, the nanofiber film 1300 may include first to third layers 1310, 1320, and 1330. According to an embodiment, the nanofiber film 1300 may be disposed to shield the opening 421. According to an embodiment, the nanofiber film 1300 may be disposed to press at least a part of the filling member 499 protruding above the opening 421. For example, when the nanofiber film 1300 is compressed on the shield can 420 to shield the opening 421, the filling member 499 may also be pressed together. The pressed filling member 499 may spread widely in the horizontal direction on the first component 401. The filling member 499 may have one side in contact with the first component 401 and the other side in contact with the nanofiber film 1300 so that the heat generated by the first component 401 can be dispersed to the nanofiber film 1300 via the filling member 499.

According to various example embodiments, an electronic device may comprise: a circuit board (e.g., the circuit board 400 in FIG. 5); a first component (e.g., the first component 401 in FIG. 5) disposed on the circuit board; a shield can (e.g., the shield can 420 in FIG. 5) disposed to surround at least a part of the first component and including an opening; and a nanofiber film (e.g., the nanofiber film 500 in FIG. 5) disposed on the shield can to cover the opening, wherein the nanofiber film includes a first layer (e.g., the first layer 510 in FIG. 7), a second layer (e.g., the second layer 520 in FIG. 7), and a third layer (e.g., the third layer 530 in FIG. 7) sequentially laminated in a first direction, the first layer or the third layer is configured to have a lower electrical resistance value than an electrical resistance value of the second layer in a second direction different from the first direction, and the second layer is configured to have a lower electrical resistance value than an electrical resistance value the first layer or the third layer in the first direction.

According to an example embodiment, the electronic device may further comprise: a heat diffusion member (e.g., the heat diffusion member 320-1 in FIG. 9) comprising a thermally conductive material disposed on the upper position of the nanofiber film.

According to an example embodiment, the first layer may be in contact with at least a part of the shield can, and the heat diffusion member may be disposed on the upper position of the third layer.

According to an example embodiment, the first layer may include a conductive filler.

According to an example embodiment, the conductive filler may include at least one of carbon-based or metal-based materials.

According to an example embodiment, the third layer may be coated with an adhesive material.

According to an example embodiment, the adhesive material may include a pressure-sensitive adhesive (PSA).

According to an example embodiment, the electronic device may further comprise: a filling member (e.g., the filling member 499 in FIG. 5) comprising a thermally conductive material disposed between the first component and the nanofiber film.

According to an example embodiment, the filling member may be in a liquid state or a semi-solid state.

According to an example embodiment, an air permeability of the first layer or the third layer may be less than an air permeability of the second layer.

According to an example embodiment, the thickness of the nanofiber of the first layer or the third layer may be less than a thickness of the nanofiber of the second layer.

According to an example embodiment, the nanofiber film further may include an auxiliary opening (e.g., auxiliary opening 601 in FIG. 12), the auxiliary opening being disposed to correspond to the opening.

According to various example embodiments, a method for manufacturing a nanofiber film is provided, the method including: bonding a lower surface of a first layer (e.g., the first layer 1110 in FIG. 15) and an upper surface of a second layer (e.g., the second layer 1120 in FIG. 15) in a first direction; bonding a lower surface of the second layer and an upper surface of a third layer (e.g., the third layer 1130 in FIG. 15) in the first direction; and plating the first, second and third layers with a conductive material, wherein an electrical resistance value of the second layer in the first direction is less than an electrical resistance value of the first layer or the third layer in the first direction.

According to an example embodiment, the electrical resistance value of the first layer or the third layer in the second direction different from the first direction may be less than the electrical resistance value of the second layer in the second direction.

According to an example embodiment, a thickness of the nanofiber of the first layer or the third layer may be less than a thickness of the nanofiber of the second layer.

According to an example embodiment, the method may further include: coating the first layer with an adhesive material, the adhesive material including a pressure-sensitive adhesive (PSA).

According to an example embodiment, a method for manufacturing a nanofiber film is provided, the method further comprising: arranging a conductive filler on the third layer, the conductive filler including at least one of carbon-based or metal-based materials.

According to various example embodiments, a method for manufacturing an electronic device is provided, the method including: preparing a circuit board, a first component disposed on the circuit board, a shield can disposed to surround at least a part of the first component and including an opening, and a nanofiber film, the nanofiber film including a first layer, a second layer, and a third layer sequentially laminated in a first direction, the first layer or the third layer having an electrical resistance value less than an electrical resistance value of the second layer in a second direction different from the first direction, the second layer having a lower electrical resistance value than an electrical resistance value of the first layer or the third layer in the first direction; arranging a filling member comprising a thermally conductive material on an upper position of first component; and arranging the nanofiber film to shield the opening.

According to an example embodiment, the method may further include: arranging a heat diffusion member on the upper position of the nanofiber film.

According to an example embodiment, the method may further include: compressing the nanofiber film to the opening so that one side of the filling member comes into contact with the first component and the other side of the filling member comes into contact with the nanofiber film.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
a circuit board;
a first component disposed on the circuit board;
a shield can disposed to surround at least a part of the first component and including an opening; and
a nanofiber film disposed on the shield can to cover the opening,
wherein the nanofiber film includes a first layer, a second layer, and a third layer sequentially laminated in a first direction,
the first layer or the third layer having a lower electrical resistance value than an electrical resistance value of the second layer in a second direction different from the first direction, and
the second layer having a lower electrical resistance value than an electrical resistance value of the first layer or the third layer in the first direction.

2. The electronic device of claim 1, the device further including: a heat diffusion member comprising heat diffusing material disposed on an upper position of the nanofiber film.

3. The electronic device of claim 2, wherein the first layer is in contact with at least a part of the shield can, and
the heat diffusion member is disposed on an upper position of the third layer.

4. The electronic device of claim 1, wherein the first layer includes a conductive filler.

5. The electronic device of claim 4, wherein the conductive filler includes at least one of carbon-based or metal-based materials.

6. The electronic device of claim 1, wherein the third layer is coated with an adhesive material.

7. The electronic device of claim 6, wherein the adhesive material includes a pressure-sensitive adhesive (PSA).

8. The electronic device of claim 1, the device further including: a filling member comprising a thermally conductive material disposed between the first component and the nanofiber film.

9. The electronic device of claim 1, wherein the filling member is in a liquid state or a semi-solid state.

10. The electronic device of claim 1, wherein an air permeability of the first layer or the third layer is less than an air permeability of the second layer.

11. The electronic device of claim 1, wherein a thickness of the nanofiber of the first layer or the third layer is less than a thickness of the nanofiber of the second layer.

12. The electronic device of claim 1, wherein the nanofiber film further includes: an auxiliary opening, and
the auxiliary opening is disposed to correspond to the opening.

* * * * *